(12) United States Patent
Ochiai et al.

(10) Patent No.: US 11,659,773 B2
(45) Date of Patent: May 23, 2023

(54) MAGNETIC MEMORY DEVICE AND MANUFACTURING METHOD OF MAGNETIC MEMORY DEVICE

(71) Applicant: Kioxia Corporation, Tokyo (JP)

(72) Inventors: Takao Ochiai, Funabashi Chiba (JP); Kazuhiro Tomioka, Seoul (KR)

(73) Assignee: Kioxia Corporation, Tokyo (JP)

( * ) Notice: Subject to any disclaimer, the term of this patent is extended or adjusted under 35 U.S.C. 154(b) by 16 days.

(21) Appl. No.: 17/198,330

(22) Filed: Mar. 11, 2021

(65) Prior Publication Data
US 2021/0288243 A1    Sep. 16, 2021

(30) Foreign Application Priority Data
Mar. 11, 2020  (JP) ................ 2020-042014

(51) Int. Cl.
| | | |
|---|---|---|
| G11C 11/00 | (2006.01) | |
| H01L 43/08 | (2006.01) | |
| H01L 43/10 | (2006.01) | |
| G11C 11/16 | (2006.01) | |
| H01L 43/12 | (2006.01) | |
| H01L 43/02 | (2006.01) | |

(52) U.S. Cl.
CPC ........... *H01L 43/08* (2013.01); *G11C 11/161* (2013.01); *H01L 43/02* (2013.01); *H01L 43/10* (2013.01); *H01L 43/12* (2013.01)

(58) Field of Classification Search
CPC ......... H01L 43/08; H01L 43/02; H01L 43/10; H01L 43/12; G11C 11/161

USPC ........................................................ 365/158
See application file for complete search history.

(56) References Cited

U.S. PATENT DOCUMENTS

| | | | | | |
|---|---|---|---|---|---|
| 6,005,800 | A | * | 12/1999 | Koch ............... | G11C 11/16 365/33 |
| 6,781,874 | B2 | * | 8/2004 | Hidaka ............ | G11C 11/16 365/158 |
| 6,891,193 | B1 | * | 5/2005 | Schwarz .......... | H01L 27/222 365/158 |
| 7,057,222 | B2 | * | 6/2006 | Jeong .............. | H01L 27/228 365/158 |
| 7,173,841 | B2 | * | 2/2007 | Peng ............... | G11C 11/15 365/158 |
| 7,349,234 | B2 | * | 3/2008 | Peng ............... | G11C 11/15 365/158 |
| 7,369,428 | B2 | * | 5/2008 | Jeong .............. | G11C 11/16 365/158 |

(Continued)

FOREIGN PATENT DOCUMENTS

| | | | | | |
|---|---|---|---|---|---|
| CN | 1254927 | A | * | 5/2000 | ...... G11C 11/15 |
| CN | 100449814 | C | * | 1/2009 | ...... B82Y 10/00 |

(Continued)

*Primary Examiner* — Viet Q Nguyen
(74) *Attorney, Agent, or Firm* — Holtz, Holtz & Volek PC

(57) ABSTRACT

According to one embodiment, a magnetic memory device includes a first conductor extending along a first direction, a second conductor extending along a second direction and above the first conductor, and a first layer stack provided between the first conductor and the second conductor and including a first magnetoresistance effect element. The first layer stack has a rectangular shape along a stack surface of the first layer stack. The rectangular shape of the first layer stack has a side intersecting with both the first direction and the second direction.

13 Claims, 19 Drawing Sheets

(56) References Cited

U.S. PATENT DOCUMENTS

| | | | | |
|---|---|---|---|---|
| 7,859,885 B2* | 12/2010 | Toda | .................... | H01L 27/2481 |
| | | | | 365/158 |
| 8,004,883 B2* | 8/2011 | Zheng | .................... | G11C 11/15 |
| | | | | 365/158 |
| 8,223,532 B2* | 7/2012 | Wang | .................. | G11C 11/1659 |
| | | | | 365/158 |
| 8,248,846 B2* | 8/2012 | Ashida | ................ | G11C 11/1659 |
| | | | | 365/158 |
| 9,508,922 B2 | 11/2016 | Yoshikawa et al. | | |
| 9,525,126 B1* | 12/2016 | Lin | ........................ | H01L 43/12 |
| 9,679,943 B2* | 6/2017 | Park | ....................... | G11C 11/161 |
| 9,698,338 B2 | 7/2017 | Yoshikawa et al. | | |
| 9,978,934 B2 | 5/2018 | Paranjpe et al. | | |
| 10,290,679 B1* | 5/2019 | Bhushan | ............... | H01L 27/228 |
| 2014/0252438 A1* | 9/2014 | Shukh | .................... | H01L 27/228 |
| | | | | 257/295 |
| 2015/0263070 A1 | 9/2015 | Lee et al. | | |
| 2016/0163971 A1* | 6/2016 | Jeong | ...................... | H01L 43/08 |
| | | | | 438/3 |
| 2017/0069836 A1 | 3/2017 | Tomioka | | |
| 2018/0190336 A1 | 7/2018 | Shirotori et al. | | |
| 2019/0207084 A1 | 7/2019 | Tzoufras et al. | | |
| 2020/0411589 A1* | 12/2020 | Wan | ....................... | H01L 43/12 |
| 2021/0288240 A1 | 9/2021 | Sawada et al. | | |

FOREIGN PATENT DOCUMENTS

| | | | | |
|---|---|---|---|---|
| JP | 2011210364 A | * 10/2011 | ............ | G11C 11/16 |
| TW | 202135062 A | 9/2021 | | |

* cited by examiner

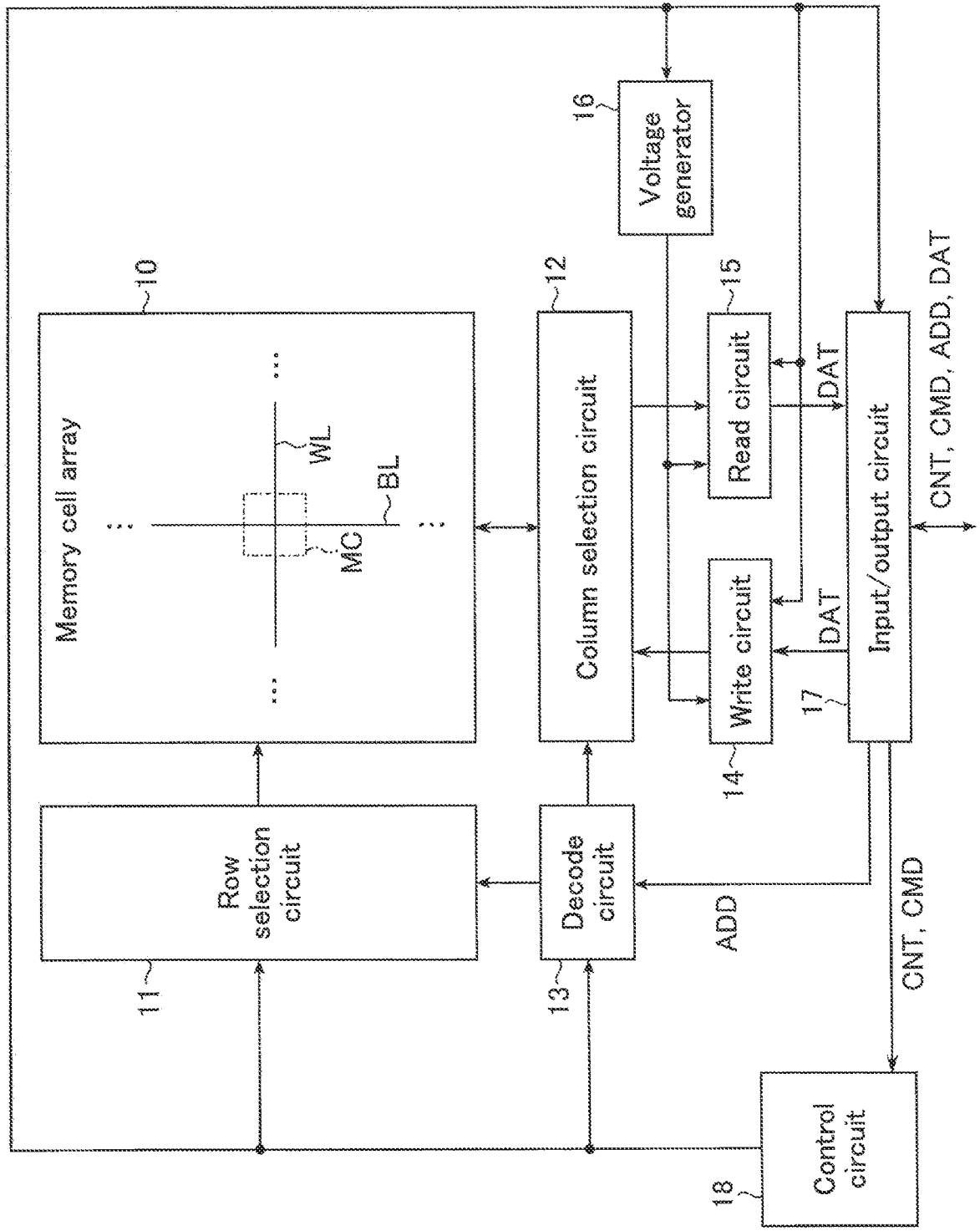
F I G. 1

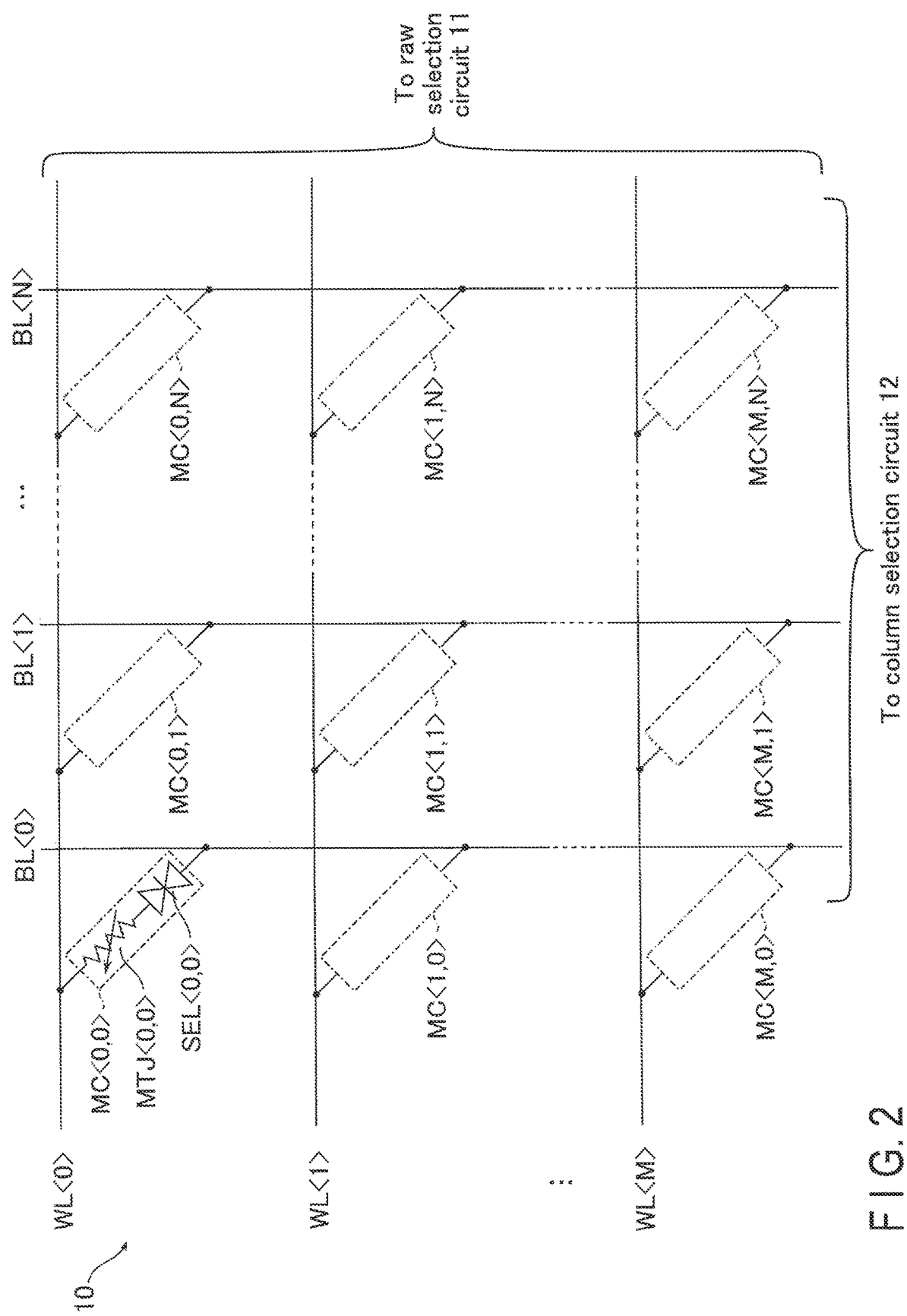
F I G. 2

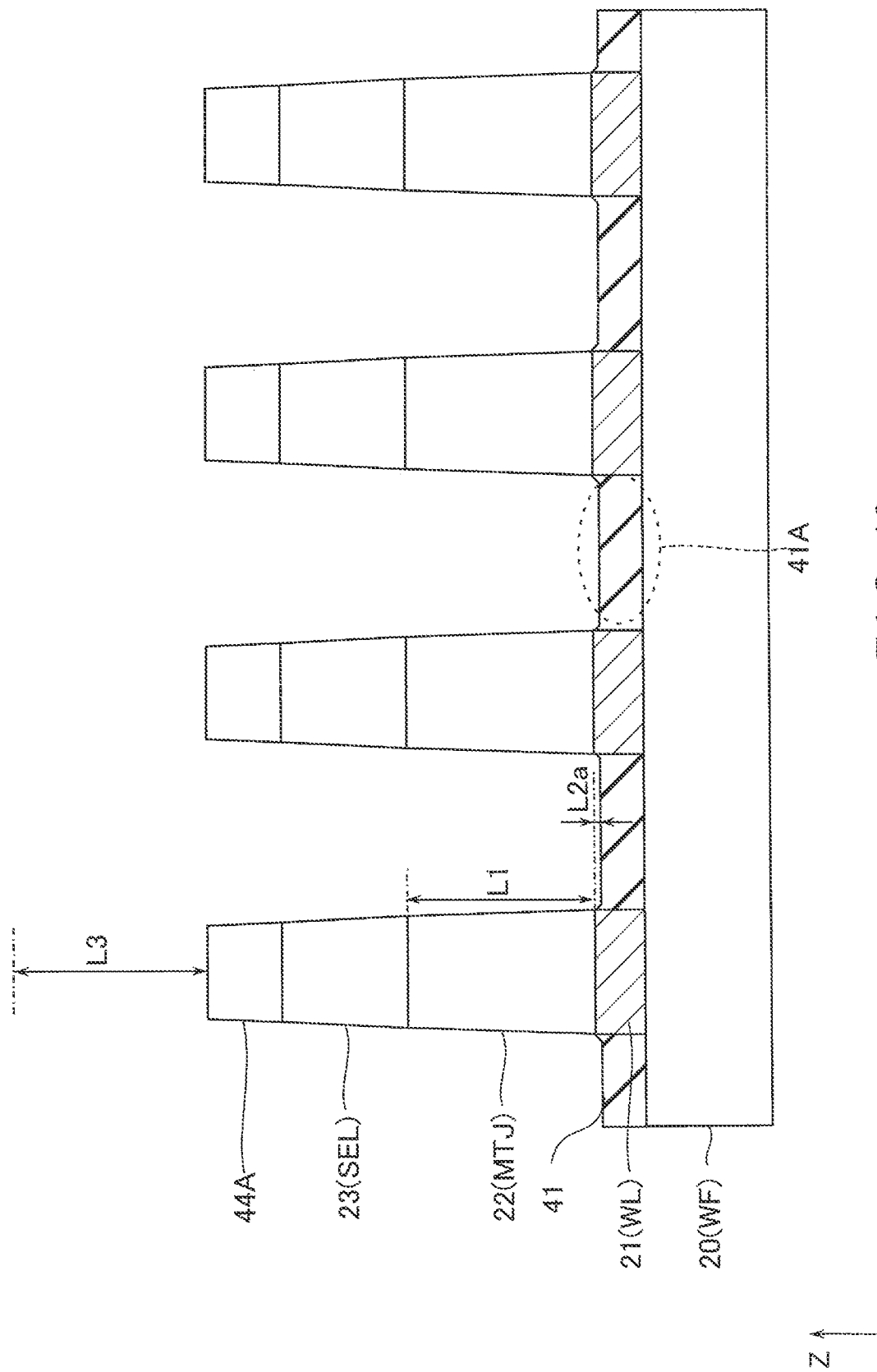
F I G. 13

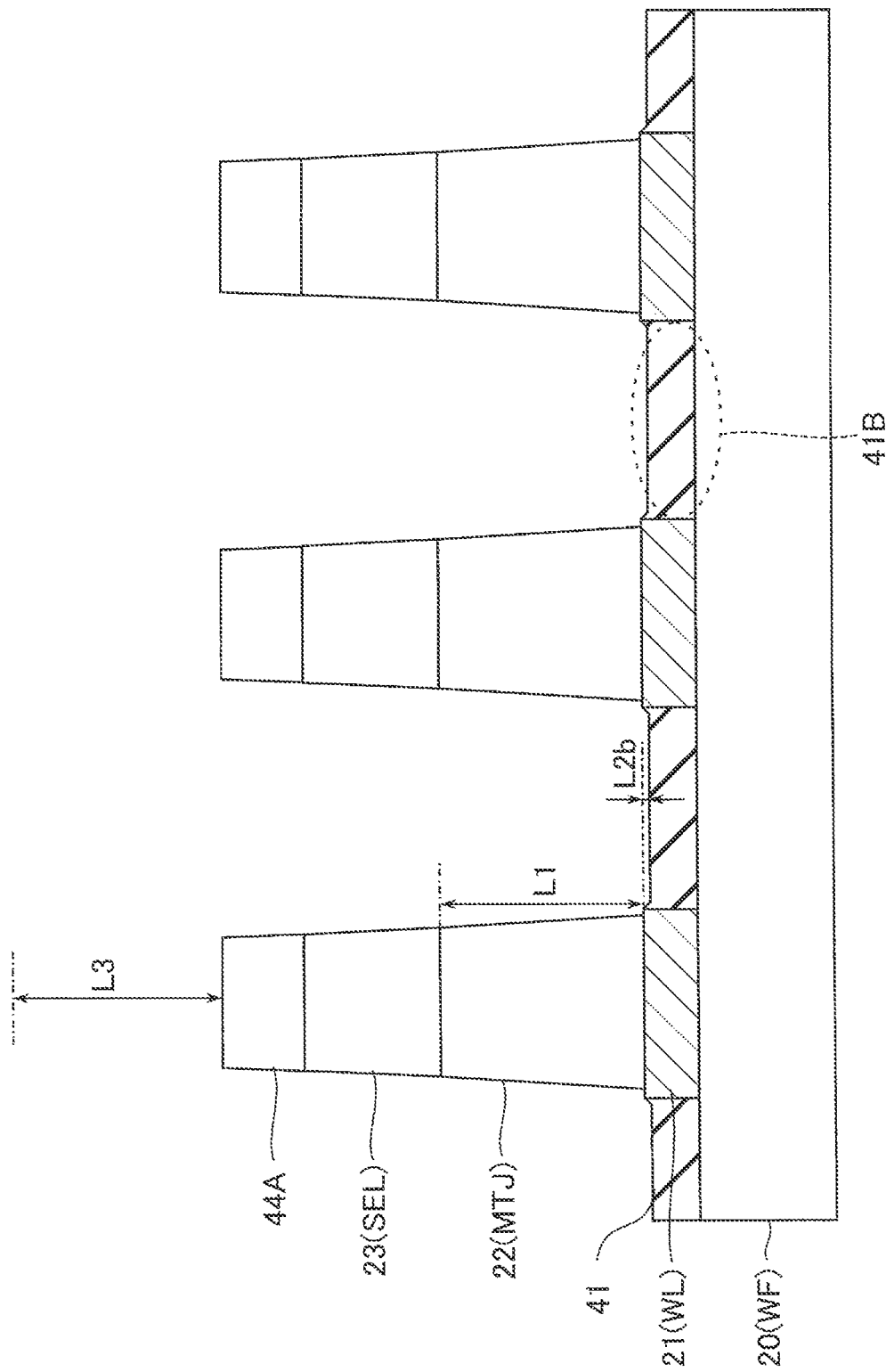
F I G. 14

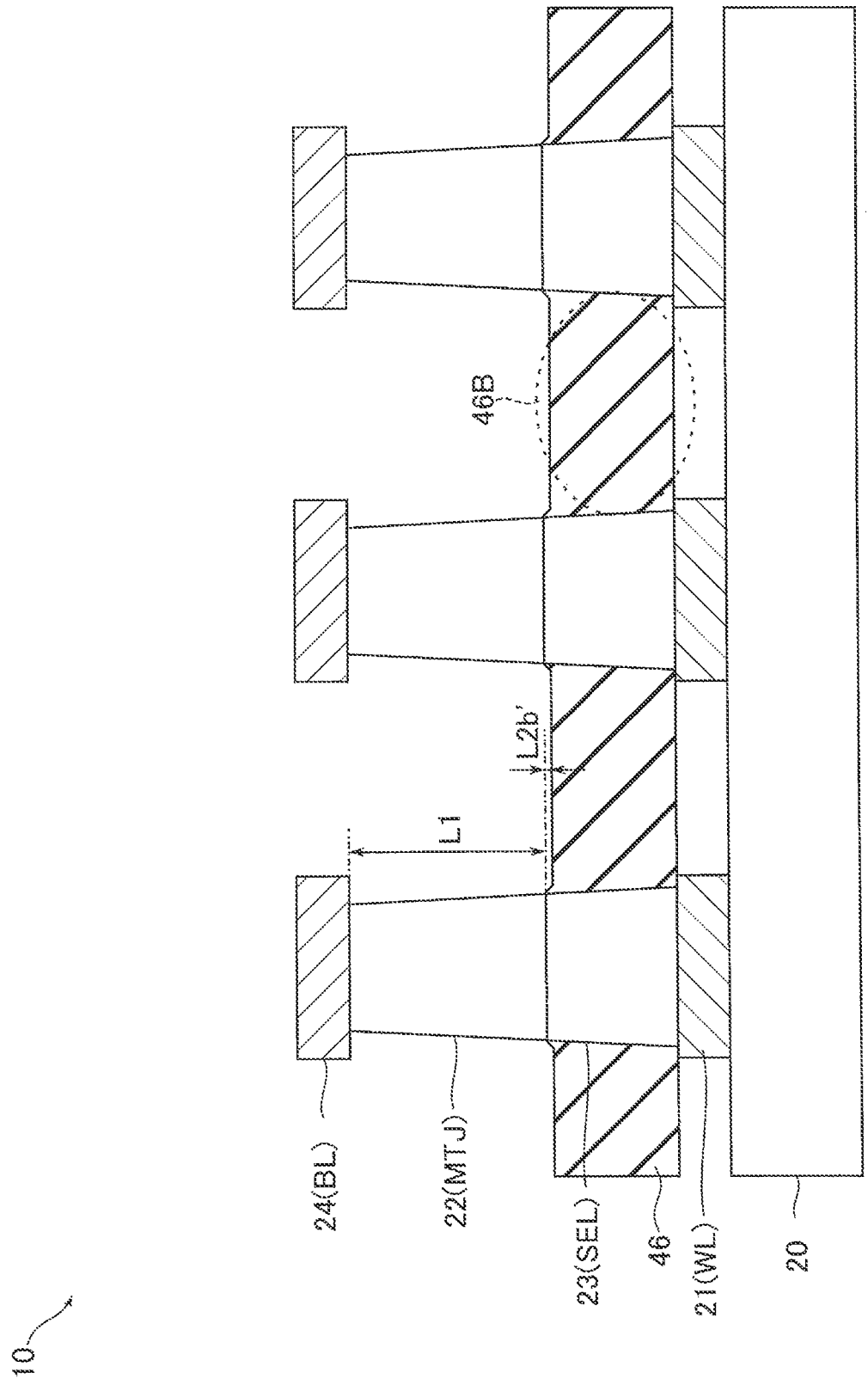
F I G. 19

MAGNETIC MEMORY DEVICE AND MANUFACTURING METHOD OF MAGNETIC MEMORY DEVICE

CROSS-REFERENCE TO RELATED APPLICATIONS

This application is based upon and claims the benefit of priority from Japanese Patent Application No. 2020-042014, filed Mar. 11, 2020, the entire contents of which are incorporated herein by reference.

FIELD

Embodiments described herein relate generally to a magnetic memory device and a manufacturing method of the magnetic memory device.

BACKGROUND

A magnetic memory device (magnetoresistive random access memory or MRAM) using a magnetoresistance effect element as a memory element has been known.

BRIEF DESCRIPTION OF THE DRAWINGS

FIG. 1 is a block diagram illustrating a configuration of a magnetic memory device according to an embodiment.

FIG. 2 is a circuit diagram illustrating a configuration of a memory cell array of the magnetic memory device according to the embodiment.

FIG. 13 is a cross-sectional view illustrating the manufacturing method of the memory cell array in the magnetic memory device according to the embodiment.

FIG. 14 is a cross-sectional view illustrating the manufacturing method of the memory cell array in the magnetic memory device according to the embodiment.

FIG. 19 is a cross-sectional view illustrating a configuration of the memory cell array of the magnetic memory device according to the modification.

DETAILED DESCRIPTION

Figure 3:
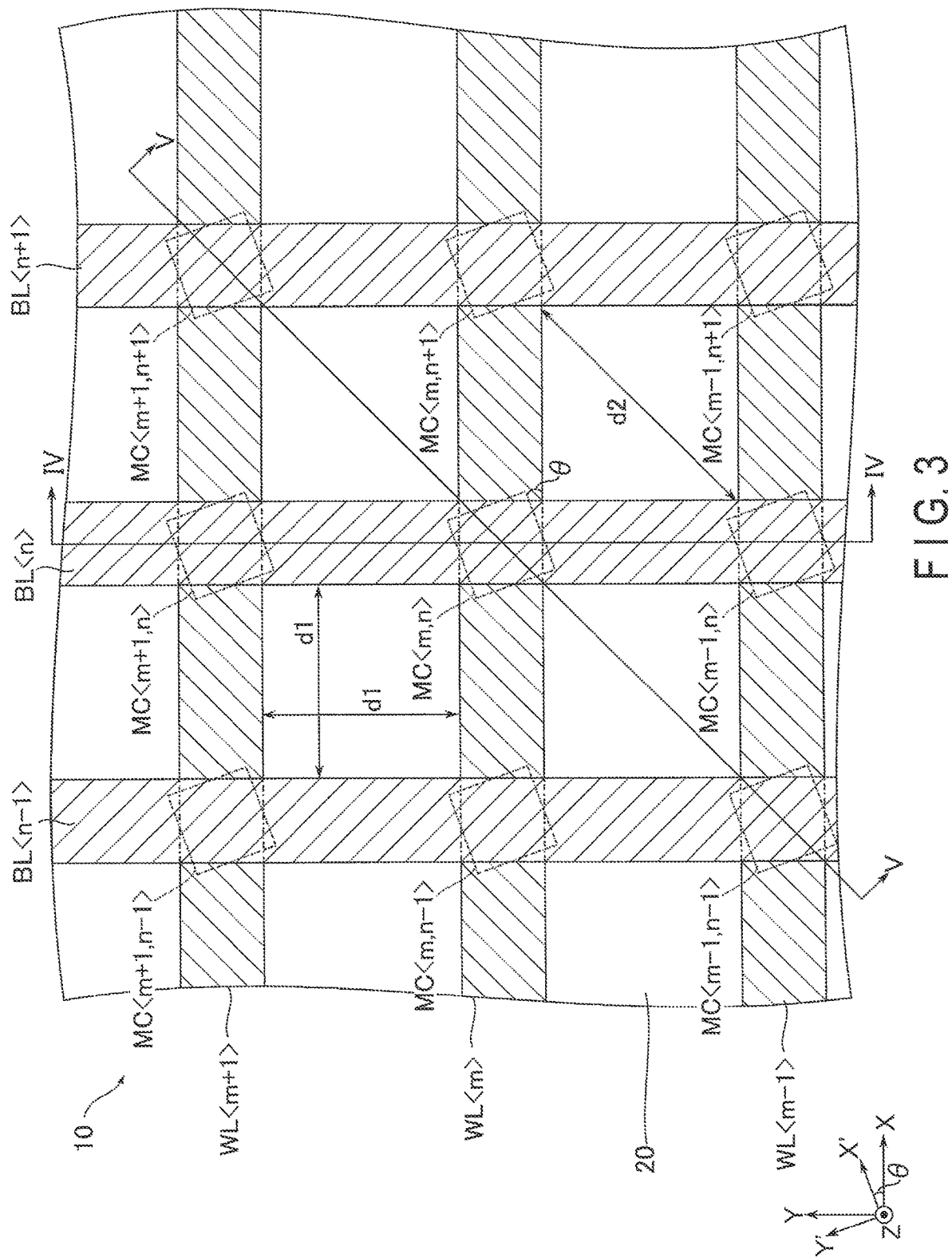
FIG. 3 is a plan view illustrating a configuration of the memory cell array of the magnetic memory device according to the embodiment.

In general, according to one embodiment, a magnetic memory device includes a first conductor extending along a first direction, a second conductor extending along a second direction and above the first conductor, and a first layer stack provided between the first conductor and the second conductor and including a first magnetoresistance effect element. The first layer stack has a rectangular shape along a stack surface of the first layer stack. The rectangular shape of the first layer stack has a side intersecting with both the first direction and the second direction.

Hereinafter, embodiments will be described with reference to the accompanying drawings. In the description below, structural elements having the same functions and configurations will be denoted by common reference symbols. To distinguish a plurality of structural elements having a common reference symbol, an additional symbol will be attached to the common reference symbol. If the structural elements do not particularly need to be distinguished from each other, only the common reference symbol will be used, and no additional symbol will be attached. Examples of such an additional symbol include a lower-case alphabetical letter and an index indicating an arrangement that are attached to the end of a reference symbol, as well as a subscript and a superscript.

1. Embodiment

A magnetic memory device according to the embodiment will be described. The magnetic memory device according to the embodiment is, for example, a perpendicular magnetization type magnetic memory device in which an element that exhibits a magnetoresistance effect through a magnetic tunnel junction (MTJ) (such an element is called an MTJ element or a magnetoresistance effect element) is used as a variable resistance element.

1.1 Configuration

First, a configuration of the magnetic memory device according to the embodiment will be described.

1.1.1 Configuration of Magnetic Memory Device

FIG. 1 is a block diagram illustrating a configuration of the magnetic memory device according to the embodiment. As shown in FIG. 1, a magnetic memory device 1 includes a memory cell array 10, a row selection circuit 11, a column selection circuit 12, a decode circuit 13, a write circuit 14, a read circuit 15, a voltage generator 16, an input/output circuit 17, and a control circuit 18.

The memory cell array 10 includes a plurality of memory cells MC, each of which is associated with a pair of a row and a column. Specifically, memory cells MC in the same row are coupled to the same word line WL, and memory cells MC in the same column are coupled to the same bit line BL.

The row selection circuit 11 is coupled to the memory cell array 10 by way of word lines WL. The row selection circuit 11 receives a decoding result of an address ADD (a row address) from the decode circuit 13. The row selection circuit 11 sets a word line WL corresponding to the row indicated by the decoding result of the address ADD to a selected state. Hereinafter, a word line WL that is set to a selected state will be referred to as a selected word line WL. Word lines WL other than the selected word line WL will be referred to as non-selected word lines WL.

The column selection circuit 12 is coupled to the memory cell array 10 by way of bit lines BL. The column selection circuit 12 receives a decoding result of address ADD (a column address) from the decode circuit 13. The column selection circuit 12 sets a bit line BL corresponding to the column indicated by the decoding result of address ADD to a selected state. Hereinafter, a bit line BL that is set to a selected state will be referred to as a selected bit line BL. Bit lines BL other than the selected bit line BL will be referred to as non-selected bit lines BL.

The decode circuit 13 decodes an address ADD received from the input/output circuit 17. The decode circuit 13 supplies a decoding result of the address ADD to the row selection circuit 11 and the column selection circuit 12. The address ADD includes addresses of a column and a row to be selected.

The write circuit 14 writes data into the memory cells MC. The write circuit 14 includes, for example, a write driver (not shown).

The read circuit 15 reads data from the memory cells MC. The read circuit 15 includes, for example, a sense amplifier (not shown).

The voltage generator 16 generates voltages for various operations of the memory cell array 10, by using a power supply voltage provided from a device (not shown) external to the magnetic memory device 1. For example, the voltage generator 16 generates different voltages required for a write operation, and outputs the generated voltages to the write circuit 14. Also, the voltage generator 16 generates different voltages required for a read operation, and outputs the generated voltages to the read circuit 15.

The input/output circuit 17 transfers an address ADD received from a device external to the magnetic memory device 1 to the decode circuit 13. The input/output circuit 17 transfers a command CMD received from a device external to the magnetic memory device 1 to the control circuit 18. The input/output circuit 17 transmits and receives various control signals CNT between a device external to the magnetic memory device 1 and the control circuit 18. The input/output circuit 17 transfers data DAT received from a device external to the magnetic memory device 1 to the write circuit 14, and outputs data DAT transferred from the read circuit 15 to a device external to the magnetic memory device 1.

The control circuit 18 controls the operations of the row selection circuit 11, the column selection circuit 12, the decode circuit 13, the write circuit 14, the read circuit 15, the voltage generator 16, and the input/output circuit 17 in the magnetic memory device 1, in accordance with the control signals CNT and the command CMD.

1.1.2 Configuration of Memory Cell Array

Next, a configuration of the memory cell array of the magnetic memory device according to the embodiment will be described with reference to FIG. 2. FIG. 2 is a circuit diagram illustrating a configuration of the memory cell array of the magnetic memory device according to the embodiment. In FIG. 2, the word lines WL are distinguished using additional symbols along with indices ("< >").

As shown in FIG. 2, the memory cells MC are arranged in a matrix in the memory cell array 10, and each of them is associated with a pair of one of the bit lines BL (BL<0>, BL<1>, . . . , BL<N>) and one of the word lines WL (WL<0>, WL<1>, . . . , WL<M>) (where M and N are any integers). Specifically, a memory cell MC<i,j> ($0 \leq i \leq M$, $0 \leq j \leq N$) is coupled between a word line WL<i> and a bit line BL<j>.

The memory cell MC<i,j> includes a switching element SEL<i,j> and a magnetoresistance effect element MTJ<i,j> that are coupled in series to each other.

The switching element SEL functions as a switch that controls the supply of current to a corresponding magnetoresistance effect element MTJ when data is written to and read from that magnetoresistance effect element MTJ. To be more specific, when a voltage applied to a certain memory cell MC is less than a threshold voltage Vth, the switching element SEL in the memory cell MC serves as an insulator having a large resistance value and blocks a current (in other words, turns to an OFF state), and when it is not less than the threshold voltage Vth, the switching element SEL in the memory cell MC serves as a conductor having a small resistance value and conducts a current (in other words, turns to an ON state). That is, the switching element SEL has a function of switching between conducting and blocking a current in accordance with the magnitude of a voltage applied to the memory cell MC, irrespective of the direction of current flow.

The switching element SEL may be, for example, a two-terminal switching element. When a voltage applied between the two terminals is lower than a threshold value, the switching element is in a "high-resistance" state, e.g., in an electrically non-conductive state. When the voltage applied across the two terminals becomes equal to or higher than a threshold value, the switching element changes into a "low-resistance" state, e.g., into an electrically conductive state. The switching element may have this function regardless of the polarity of the voltage.

The magnetoresistance effect element MTJ can switch its resistance value between a low-resistance state and a high-resistance state in accordance with a current whose supply is controlled by the switching element SEL. The magnetoresistance effect element MTJ functions as a memory element that uses the change in its resistance state to write and read data and store data in a non-volatile manner.

Next, the shape of the memory cells MC and the arrangement of the memory cells MC with respect to the bit lines BL and the word lines WL in the memory cell array 10 will be described with reference to FIG. 3. FIG. 3 shows an example of a plan view illustrating a configuration of the memory cell array of the magnetic memory device according to the embodiment. In FIG. 3, a plurality of memory cells MC ($1 \leq m \leq M-1$, $1 \leq n \leq N-1$) are shown between three word lines WL<m-1>, WL<m>, WL<m+1> and three bit lines BL<n-1>, BL<n>, BL<n+1> in the memory cell array 10. For the sake of convenience of description, interlayer insulating films are not shown in FIG. 3.

As shown in FIG. 3, the memory cell array 10 is provided above a semiconductor substrate 20. In the description below, a plane parallel to the surface of the semiconductor substrate 20 is defined as an XY plane, and an axis perpendicular to the XY plane is defined as a Z axis. The direction of approaching the semiconductor substrate 20 along the Z axis is defined as a "downward" direction, and the direction of departing from the semiconductor substrate 20 along the Z axis is defined as an "upward" direction. Of a pair of two axes orthogonal to each other in the XY plane, one axis is defined as an X axis, and the other is defined as a Y axis. Further, in the XY plane, axes made by rotating the X and Y axes about the Z axis by θ are defined as an X' axis and a Y' axis, respectively.

A plurality of memory cells MC are provided between the word lines WL and the bit lines BL. Although FIG. 3 shows an example in which the word lines WL are provided below the memory cells MC and the bit lines BL are provided above the memory cells MC, the example is not restrictive; the positional relationship between the word lines WL and the bit lines BL may be reversed.

Each of the memory cells MC has a rectangular shape along an XY cross section. For example, the rectangular cross section of each memory cell MC has sides parallel to the X' or Y' axis. That is, the rectangular cross section of each memory cell MC may be similar to the shape obtained by rotating a rectangular intersection of the word line WL and the bit line BL about the Z axis by θ.

The word lines WL extend along the X axis, and are aligned along the Y axis. The bit lines BL extend along the Y axis, and align along the X axis. The distance between two word lines WL and the distance between two bit lines BL may be set, for example, to be substantially equal. Each memory cell MC is provided at an intersection of a single bit line BL and a single word line WL. That is, the distance between two memory cells adjacent to each other in contact with the same bit line BL or the same word line WL (e.g., memory cells MC<m,n> and MC<m,n+1>, or memory cells MC<m,n> and MC<m+1,n>), which is defined as a length d1, is shorter than the distance between two diagonally adjacent memory cells (e.g., memory cells MC<m,n> and MC<m+1,n+1>), which is defined as a length d2.

Figure 4:
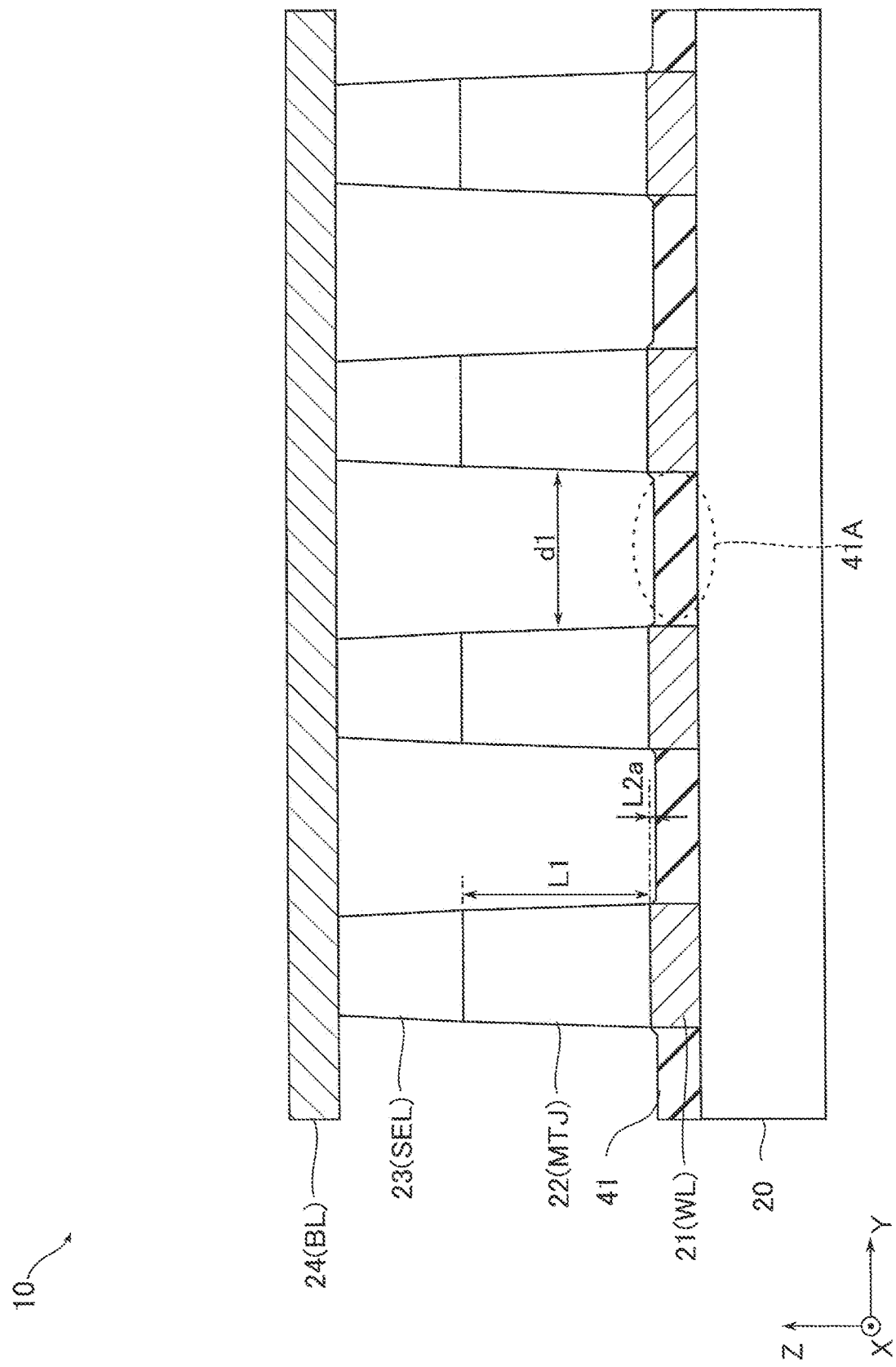
FIG. 4 is a cross-sectional view illustrating a configuration of the memory cell array of the magnetic memory device according to the embodiment.
Figure 5:
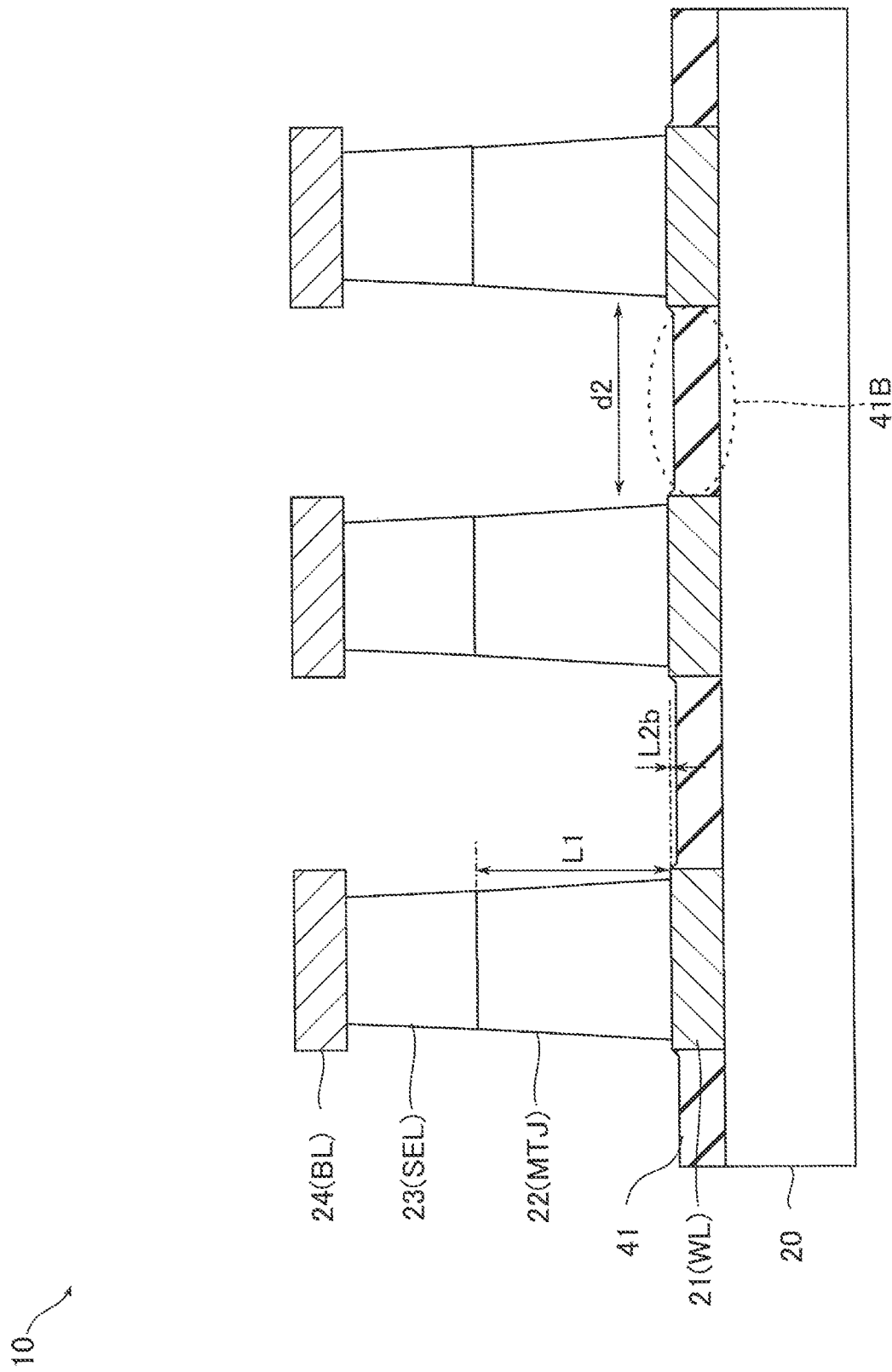
FIG. 5 is a cross-sectional view illustrating a configuration of the memory cell array of the magnetic memory device according to the embodiment.

Next, a cross-sectional configuration of the memory cell array 10 will be described with reference to FIGS. 4 and 5. FIGS. 4 and 5 each show an example of a cross-sectional view illustrating a configuration of the memory cell array of the magnetic memory device according to the embodiment. FIGS. 4 and 5 are cross-sectional views taken along line IV-IV and line V-V shown in FIG. 3, respectively.

As shown in FIGS. 4 and 5, the memory cell array 10 is provided above the semiconductor substrate 20.

For example, a plurality of conductors 21 are provided on the upper surface of the semiconductor substrate 20. Each of the conductors 21 has conductivity and it functions as a word line WL. An insulator 41 is provided between two adjacent conductors 21. With this configuration, the conductors 21 are insulated from each other. Although FIGS. 4 and 5 each show an example in which the conductors 21 are provided on the semiconductor substrate 20, the example is not restrictive. For example, the conductors 21 may be provided above the semiconductor substrate 20 without being in contact with the semiconductor substrate 20.

On an upper surface of each conductor 21, a plurality of elements 22 that each function as a magnetoresistance effect element MTJ are provided. Each element 22 has a height L1 along the Z axis and has a tapered shape such that its cross-sectional area along the XY plane becomes smaller in an upward direction. For example, the elements 22 provided on the upper surface of one conductor 21 are aligned along the X axis. In other words, the elements 22 aligned along the X axis are commonly coupled to the upper surface of one conductor 21. The configuration of the elements 22 will be described in detail later.

An upper surface of a portion 41A of the insulator 41 between two elements 22 adjacent to each other along the cross section shown in FIG. 4 is located at a level lower than that of lower surfaces of the elements 22 by height L2a. There is almost no change in the level of the upper surface of the portion 41A irrespective of the distance from the elements 22.

An upper surface of a portion 41B of the insulator 41 between two elements 22 adjacent to each other along the cross section shown in FIG. 5 is positioned at a level lower than that of lower surfaces of the elements 22 by height L2b. There is almost no change in the level of the upper surface of the portion 41B irrespective of the distance from the elements 22, as with the upper surface of the portion 41A.

On an upper surface of each element 22, an element 23 that functions as a switching element SEL is provided. Like the element 22, the element 23 has a tapered shape such that its cross-sectional area along the XY plane becomes smaller in an upward direction. An upper surface of each of a plurality of elements 23 are coupled to one of a plurality of conductors 24.

The conductors 24 have conductivity, and they function as bit lines BL. A plurality of elements 23 aligned along the Y axis are commonly coupled to a single conductor 24. Although FIGS. 4 and 5 each show an example in which each of the elements 23 is provided in contact with the element 22 and the conductor 24, the example is not restrictive. For example, each element 23 may be coupled to the element 22 and the conductor 24 via a conductive contact plug (not shown).

In the above-described configuration of the memory cell array 10, the height L2a and the height L2b can be regarded as being substantially the same. That is, the upper surface of the portion 41A and the upper surface of the portion 41B in the insulator 41 can be regarded as being positioned at the same level. Specifically, the ratio of the height (L1+L2b) to the height (L1+L2a) may be, for example, 0.9 or more and 1.5 or less (i.e., 0.9≤(L1+L2b)/(L1+L2a)≤1.5). More desirably, the ratio of the height (L1+L2b) to the height (L1+L2a) may be 0.9 or more and 1.1 or less (i.e., 0.9≤(L1+L2b)/(L1+L2a)≤1.1).

In the description below, the ratio of the height of the elements 22 to the distance between two of the elements 22 adjacent to each other in a direction along the X or Y axis will also be referred to as an aspect ratio AR. In the examples shown in FIGS. 3 to 5, when the distance between two elements 22 adjacent to each other in the direction along the X or Y axis is the length d1, the aspect ratio AR of the memory cell array 10 is defined, for example, by AR=L1/d1. The aspect ratio AR is desirably set to 1 or greater, and is more desirably set to around 1.5 or greater. The length d1 is desirably set, for example, to 50 nm or less.

1.1.3 Magnetoresistance Effect Element

Figure 6:
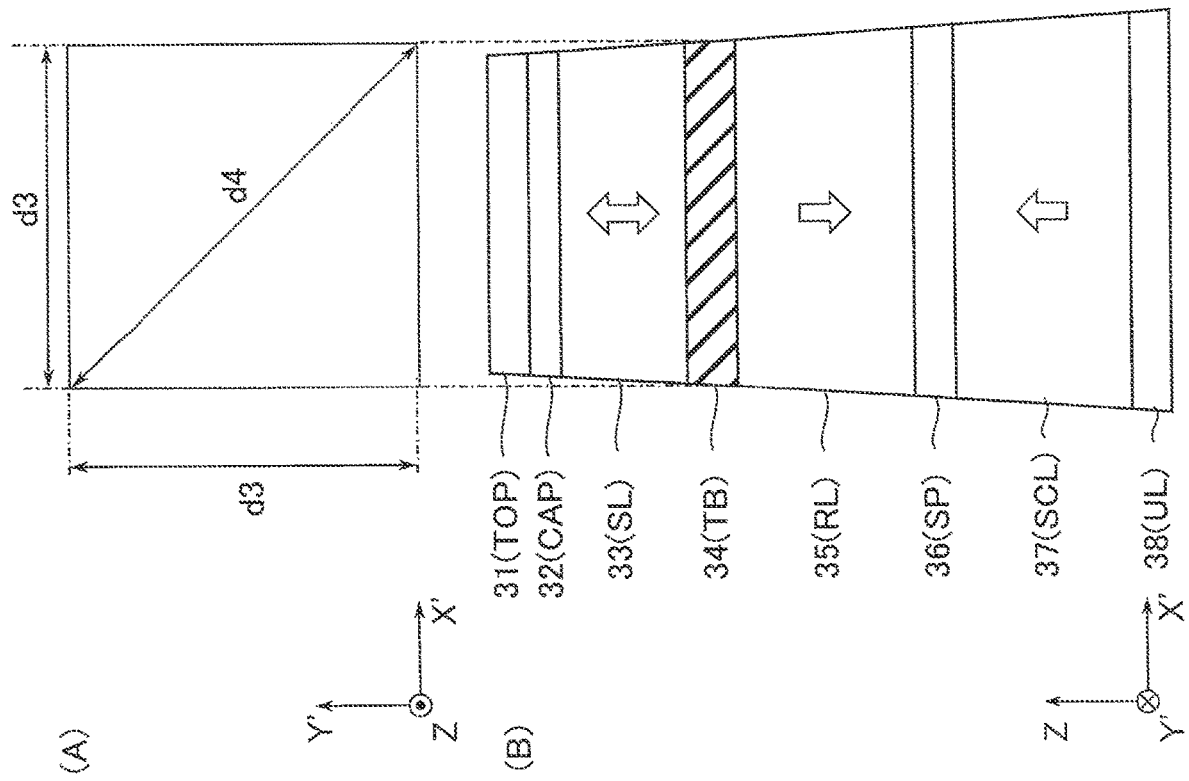
FIG. 6 is a cross-sectional view illustrating a configuration of a magnetoresistance effect element of the magnetic memory device according to the embodiment.

Next, a configuration of a magnetoresistance effect element of the magnetic memory device according to the embodiment will be described with reference to FIG. 6. FIG. 6 shows cross-sectional views each illustrating a configuration of the magnetoresistance effect element of the magnetic memory device according to the embodiment. FIG. 6(A) shows an example of a cross section of a tunnel barrier layer TB of the magnetoresistance effect element MTJ, taken along an X'Y' plane. FIG. 6(B) shows an example of a cross section of the magnetoresistance effect element MTJ shown in, for example, FIGS. 4 and 5, taken along a plane perpendicular to the Z axis (e.g., an X'Z plane).

First, referring to FIG. 6(A), a cross-sectional shape of the magnetoresistance effect element MTJ along the X'Y' plane will be described.

As shown in FIG. 6(A), the magnetoresistance effect element MTJ is a rectangle (e.g., a square) with a side length d3 as viewed from above. Although FIG. 6(A) shows a cross-sectional shape of the tunnel barrier layer TB along the X'Y' plane by way of example, the other layers of the magnetoresistance effect element MTJ also have cross-sectional shapes similar to that shown in FIG. 6(A), except for the difference in size due to the tapered shape of the magnetoresistance effect element MTJ along the Z axis.

The tunnel barrier layer TB of the magnetoresistance effect element MTJ has a length d4 longer than the length d3, along the diagonal direction of the rectangle in the cross section along the X'Y' plane. It is desirable that the length d3 be set, for example, to 20 nm or less, and that the requirement for the length d3 (e.g., d3≤20 nm) and the aforementioned requirement for the length d1 (e.g., d1≤50 nm) be satisfied at the same time.

Next, referring to FIG. 6(B), a cross-sectional shape of the magnetoresistance effect element MTJ along the Z axis will be described.

As shown in FIG. 6(B), the magnetoresistance effect element MTJ includes, for example, a nonmagnet 31 that functions as a top layer TOP, a nonmagnet 32 that functions as a capping layer CAP, a ferromagnet 33 functioning as a storage layer SL, a nonmagnet 34 functioning as a tunnel barrier layer TB, a ferromagnet 35 functioning as a reference layer RL, a nonmagnet 36 functioning as a spacer layer SP, a ferromagnet 37 functioning as a shift cancelling layer SCL, and a nonmagnet 38 functioning as an under layer UL.

In the magnetoresistance effect element MTJ, a plurality of films are stacked, for example, in the order of the nonmagnet 38, the ferromagnet 37, the nonmagnet 36, the ferromagnet 35, the nonmagnet 34, the ferromagnet 33, the nonmagnet 32, and the nonmagnet 31 from the word line WL side toward the bit line BL side (in the Z axis direction). The magnetoresistance effect element MTJ functions as, for example, a perpendicular-magnetization type MTJ element in which the magnetization directions of the magnets constituting the magnetoresistance effect element MTJ are each perpendicular to the film surface. The magnetoresistance effect element MTJ may include a further layer that is not shown, between the layers 31 to 38.

The nonmagnet 31 is a non-magnetic conductor, and functions as a top electrode that enhances the electric connectivity between the upper end of the magnetoresistance effect element MTJ and the bit line BL or word line WL. The nonmagnet 31 contains at least one element or compound selected from, for example, tungsten (W), tantalum (Ta), tantalum nitride (TaN), titanium (Ti), and titanium nitride (TiN).

The nonmagnet 32 is a non-magnetic layer and has functions of suppressing an increase of a damping constant of the ferromagnet 33 and reducing a write current. The nonmagnet 32 contains at least one nitride or oxide selected from, for example, magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The nonmagnet 32 may be a mixture of any of these nitrides and oxide. That is, the nonmagnet 32 is not limited to a binary compound containing two different elements, and may be a ternary compound containing three different elements, such as titanium aluminum nitride (AlTiN).

The ferromagnet 33 exhibits ferromagnetism, and has an easy magnetization axis in a direction perpendicular to the film surface. The ferromagnet 33 has a magnetization direction oriented toward either the bit line BL side or the word line WL side along the Z axis. The ferromagnet 33 contains at least one of iron (Fe), cobalt (Co), and nickel (Ni), and it further contains boron (B). More specifically, the ferromagnet 33 may contain, for example, iron cobalt boron (FeCoB) or iron boron (FeB), and have a body-centered cubic crystal structure.

The nonmagnet 34 is a non-magnetic insulator, and it contains, for example, magnesium oxide (MgO), and may further contain boron (B). The nonmagnet 34 has a NaCl crystal structure in which the film surface is oriented in a (001) plane, and it functions, in a crystallization process of the ferromagnet 33, as a core seed material for developing a crystalline film from an interface with the ferromagnet 33. The nonmagnet 34 is provided between the ferromagnet 33 and the ferromagnet 35, and forms, together with these two ferromagnets, a magnetic tunnel junction.

The ferromagnet 35 exhibits ferromagnetism, and has an easy magnetization axis in a direction perpendicular to the film surface. The ferromagnet 35 has a magnetization direction oriented toward either the bit line BL side or the word line WL side along the Z axis. The ferromagnet 35 contains, for example, at least one of iron (Fe), cobalt (Co), and nickel (Ni). The ferromagnet 35 may further contain boron (B). More specifically, the ferromagnet 35 may contain, for example, iron cobalt boron (FeCoB) or iron boron (FeB), and have a body-centered cubic crystal structure. The magnetization direction of the ferromagnet 35 is fixed, and it is oriented toward the ferromagnet 37 in the example of FIG. 6. "Fixed" magnetization direction means that the magnetization direction is not changed even by a current (spin torque) large enough to reverse the magnetization direction of the ferromagnet 33.

Although not shown in FIG. 6, the ferromagnet 35 may be a layer stack including a plurality of layers. Specifically, the layer stack that constitutes the ferromagnet 35 may have a structure in which a layer containing the aforementioned iron cobalt boron (FeCoB) or iron boron (FeB) is included as an interface layer with the nonmagnet 34, and in which a further ferromagnet is stacked between the interface layer and the nonmagnet 36 via a non-magnetic conductor. The non-magnetic conductor in the layer stack constituting the ferromagnet 35 may contain at least one metal selected from, for example, tantalum (Ta), hafnium (Hf), tungsten (W), zirconium (Zr), molybdenum (Mo), niobium (Nb), and titanium (Ti). The further ferromagnet in the layer stack constituting the ferromagnet 35 may include at least one multilayer film selected from, for example, a multilayer film (Co/Pt multilayer film) containing cobalt (Co) and platinum (Pt), a multilayer film (Co/Ni multilayer film) containing cobalt (Co) and nickel (Ni), and a multilayer film (Co/Pd multilayer film) containing cobalt (Co) and palladium (Pd).

The nonmagnet 36 is a non-magnetic conductor, and contains at least one element selected from, for example, ruthenium (Ru), osmium (Os), iridium (Ir), vanadium (V), and chromium (Cr).

The ferromagnet 37 exhibits ferromagnetism, and has an easy magnetization axis in a direction perpendicular to the film surface. The ferromagnet 37 has a magnetization direction oriented toward either the bit line BL side or the word line WL side along the Z axis. The magnetization direction of the ferromagnet 37 is fixed, as with the ferromagnet 35, and it is oriented toward the ferromagnet 35 in the example of FIG. 6. The ferromagnet 37 contains at least one alloy selected from, for example, cobalt platinum (CoPt), cobalt nickel (CoNi), and cobalt palladium (CoPd). The ferromagnet 37 may be a layer stack including a plurality of layers, as with the ferromagnet 35. If this is the case, the ferromagnet 37 may include at least one multilayer film selected from, for example, a multilayer film (Co/Pt multilayer film) containing cobalt (Co) and platinum (Pt), a multilayer film (Co/Ni multilayer film) containing cobalt (Co) and nickel (Ni), and a multilayer film (Co/Pd multilayer film) containing cobalt (Co) and palladium (Pd).

The ferromagnets 35 and 37 are antiferromagnetically coupled by the nonmagnet 36. That is, the ferromagnets 35 and 37 are coupled so as to have magnetization directions antiparallel to each other. Accordingly, in the example of FIG. 6, the magnetization directions of the ferromagnets 35 and 37 are opposite to each other. Such a structure that couples the ferromagnet 35, the nonmagnet 36, and the ferromagnet 37 together is called a synthetic anti-ferromagnetic (SAF) structure. This structure allows the ferromagnet 37 to compensate for the effect that the stray field of the ferromagnet 35 may have on the magnetization direction of the ferromagnet 33. It is thus possible to suppress an occurrence of asymmetry in the ease of reversing the magnetization direction of the ferromagnet 33 (i.e., the ease of reversing the magnetization direction of the ferromagnet 33 when reversing from one direction to the other is different than when reversing in the opposite direction) due to the stray field of the ferromagnet 35, etc.

The nonmagnet 38 is a non-magnetic conductor and functions as an electrode that enhances the electric connectivity with the bit line BL or the word line WL. The nonmagnet 38 contains, for example, a high-melting-point metal. The high-melting-point metal is a material having a melting point higher than that of iron (Fe) and cobalt (Co), and contains at least one element selected from, for example, zirconium (Zr), hafnium (Hf), tungsten (W), chromium (Cr), molybdenum (Mo), niobium (Mb), titanium (Ti), tantalum (Ta), vanadium (V), ruthenium (Ru), and platinum (Pt).

The embodiment adopts a spin injection write system in which a write current is fed through the above-described magnetoresistance effect element MTJ, and a spin torque is injected into the storage layer SL and the reference layer RL with the write current, thereby controlling the magnetization directions of the storage layer SL and the reference layer RL. The magnetoresistance effect element MTJ can take either a low-resistance state or a high-resistance state, according to whether the relative relationship between the magnetization directions of the storage layer SL and the reference layer RL is parallel or antiparallel.

When a write current Ic0 of a certain magnitude is fed through the magnetoresistance effect element MTJ in the direction of arrow A1 in FIG. 6, i.e., in the direction from the storage layer SL toward the reference layer RL, the relative relationship between the magnetization directions of the storage layer SL and the reference layer RL becomes parallel. In this parallel state, the magnetoresistance effect element MTJ takes the lowest resistance value, and is set to the low-resistance state. This low-resistance state is called a "P (parallel) state", and is defined, for example, as a state of data "0".

Also, when a write current Ic1 of a magnitude greater than that of the write current Ic0 is fed through the magnetoresistance effect element MTJ in the direction of arrow A2 in FIG. 6, i.e., in the direction from the reference layer RL toward the storage layer SL (opposite to the direction of arrow A1), the relative relationship between the magnetization directions of the storage layer SL and the reference layer RL becomes antiparallel. In this antiparallel state, the magnetoresistance effect element MTJ takes the highest resistance value, and is set to the high-resistance state. This high-resistance state is called an "AP (antiparallel) state", and is defined, for example, as a state of data "1".

A description will be given below in accordance with the above-described definitions of data; however, the definitions of data "1" and data "0" are not limited to them. For example, the P state may be defined as a state of data "1", and the AP state may be defined as a state of data "0".

1.2 Manufacturing Method of Memory Cell Array

Next, a manufacturing method of the memory cell array of the magnetic memory device according to the embodiment will be described. In the following, details of the stacked structure constituting the magnetoresistance effect element MTJ and switching element SEL will not be described.

Figure 7:
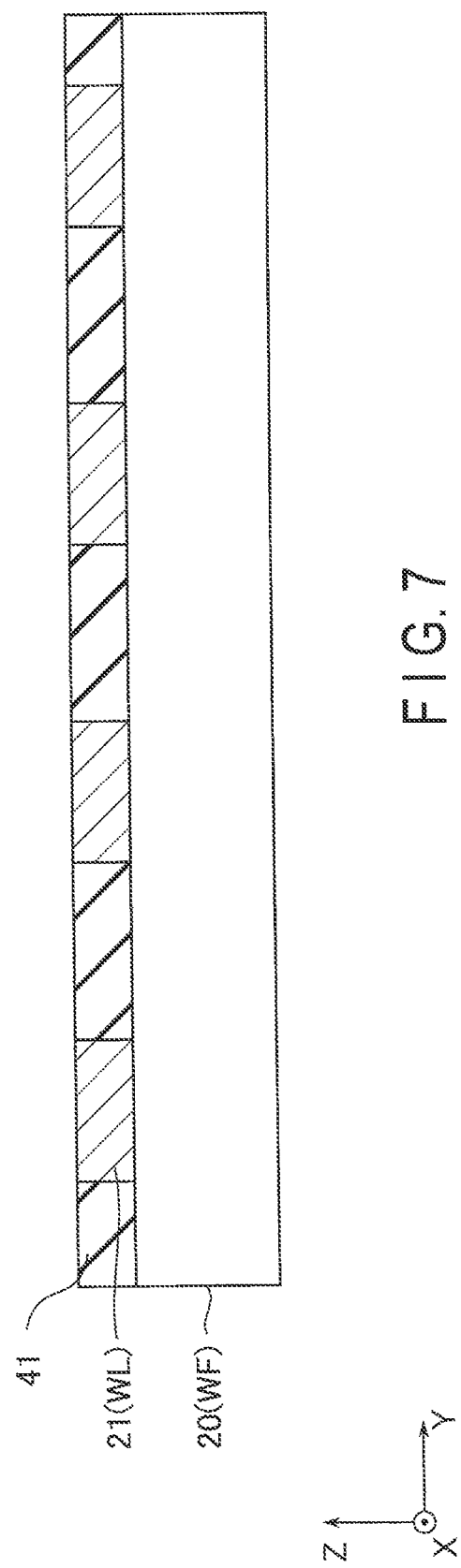
FIG. 7 is a cross-sectional view illustrating a manufacturing method of the memory cell array in the magnetic memory device according to the embodiment.
Figure 8:
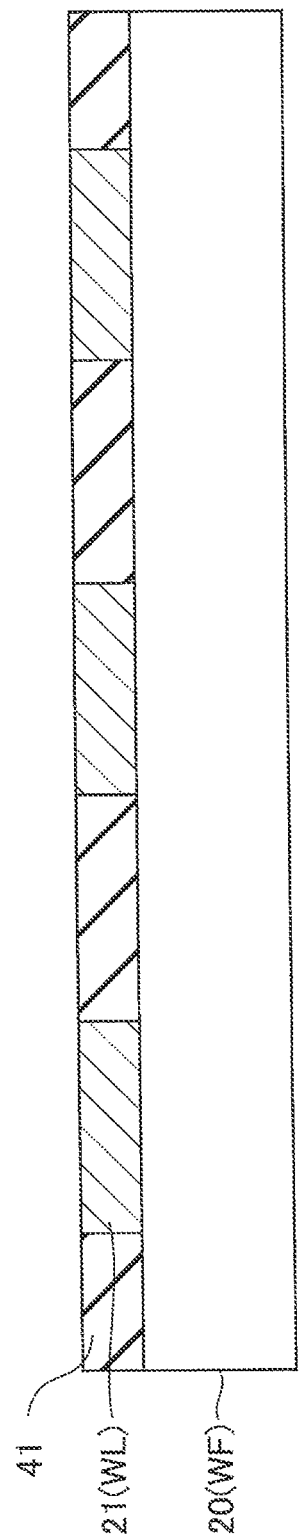
FIG. 8 is a cross-sectional view illustrating the manufacturing method of the memory cell array in the magnetic memory device according to the embodiment.
Figure 9:
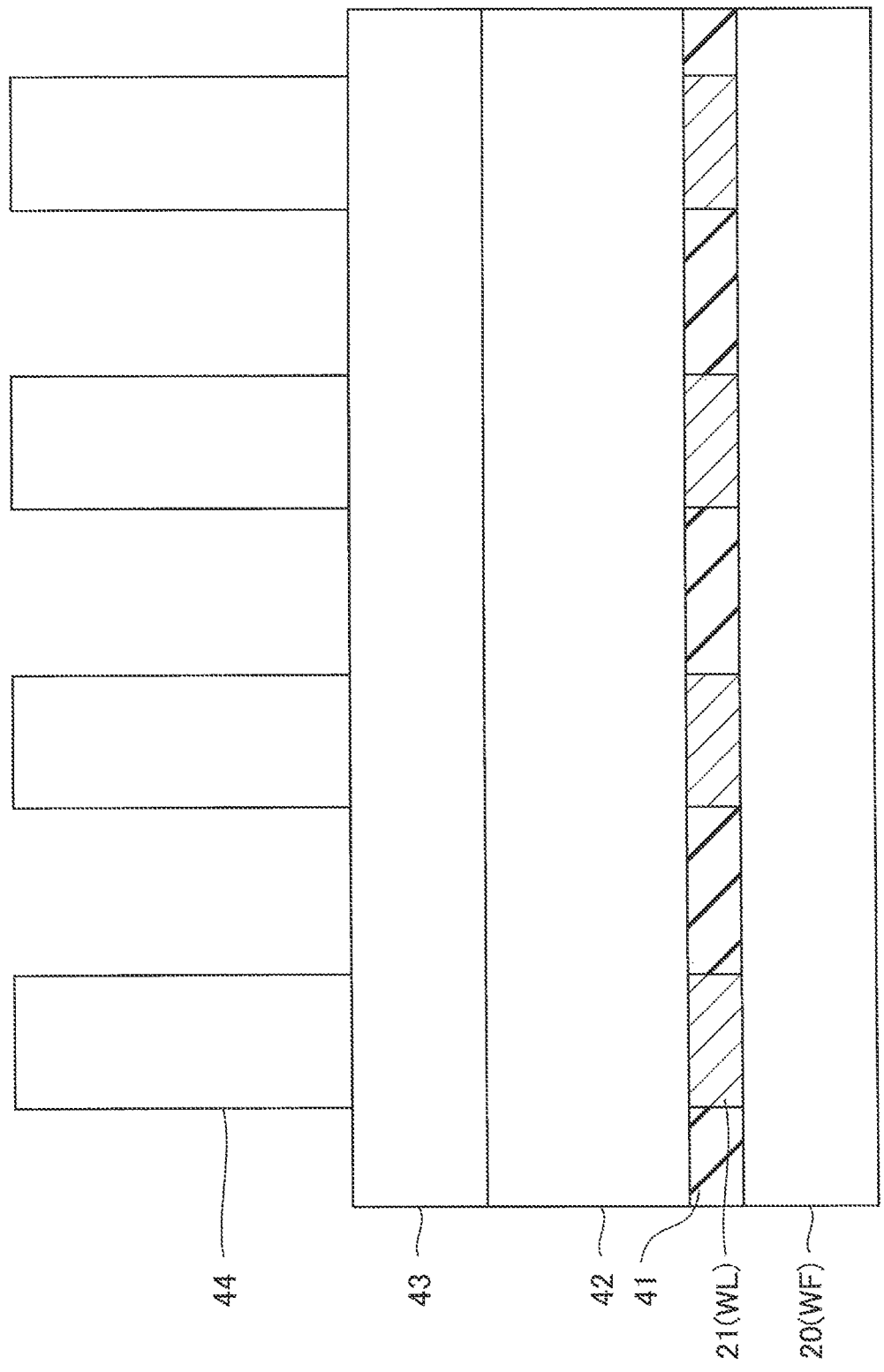
FIG. 9 is a cross-sectional view illustrating the manufacturing method of the memory cell array in the magnetic memory device according to the embodiment.
Figure 10:
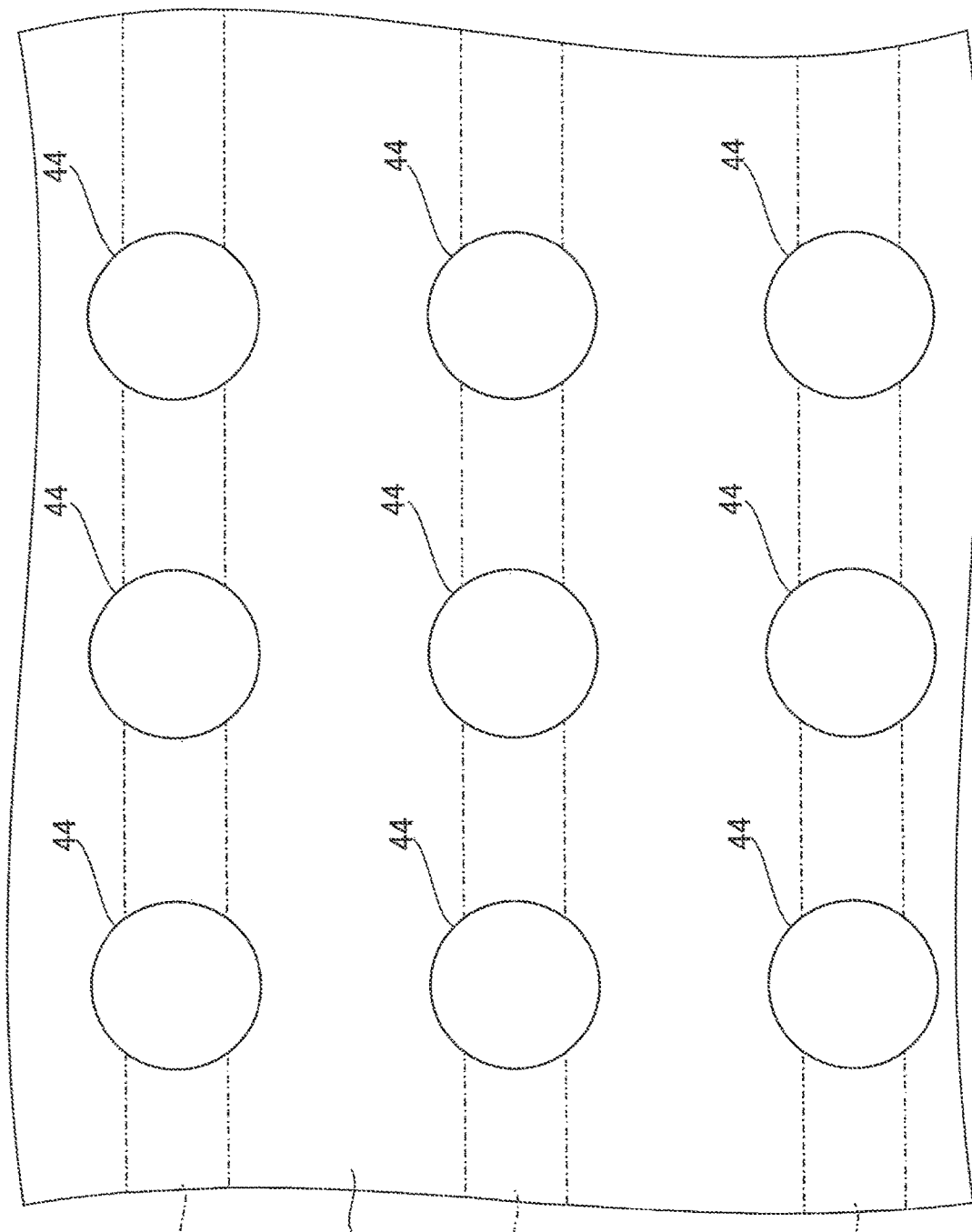
FIG. 10 is a plan view illustrating the manufacturing method of the memory cell array in the magnetic memory device according to the embodiment.
Figure 11:
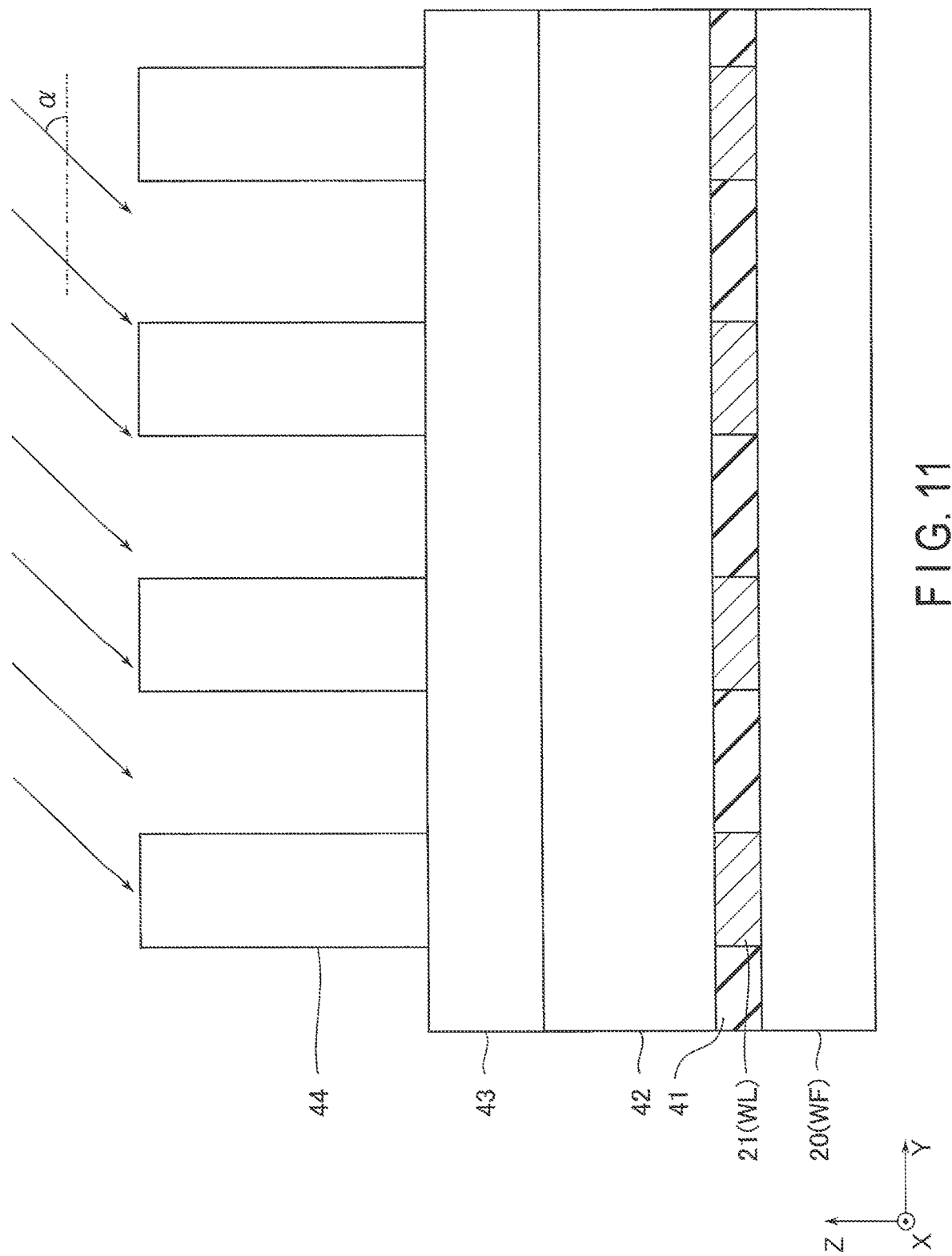
FIG. 11 is a cross-sectional view illustrating the manufacturing method of the memory cell array in the magnetic memory device according to the embodiment.
Figure 12:
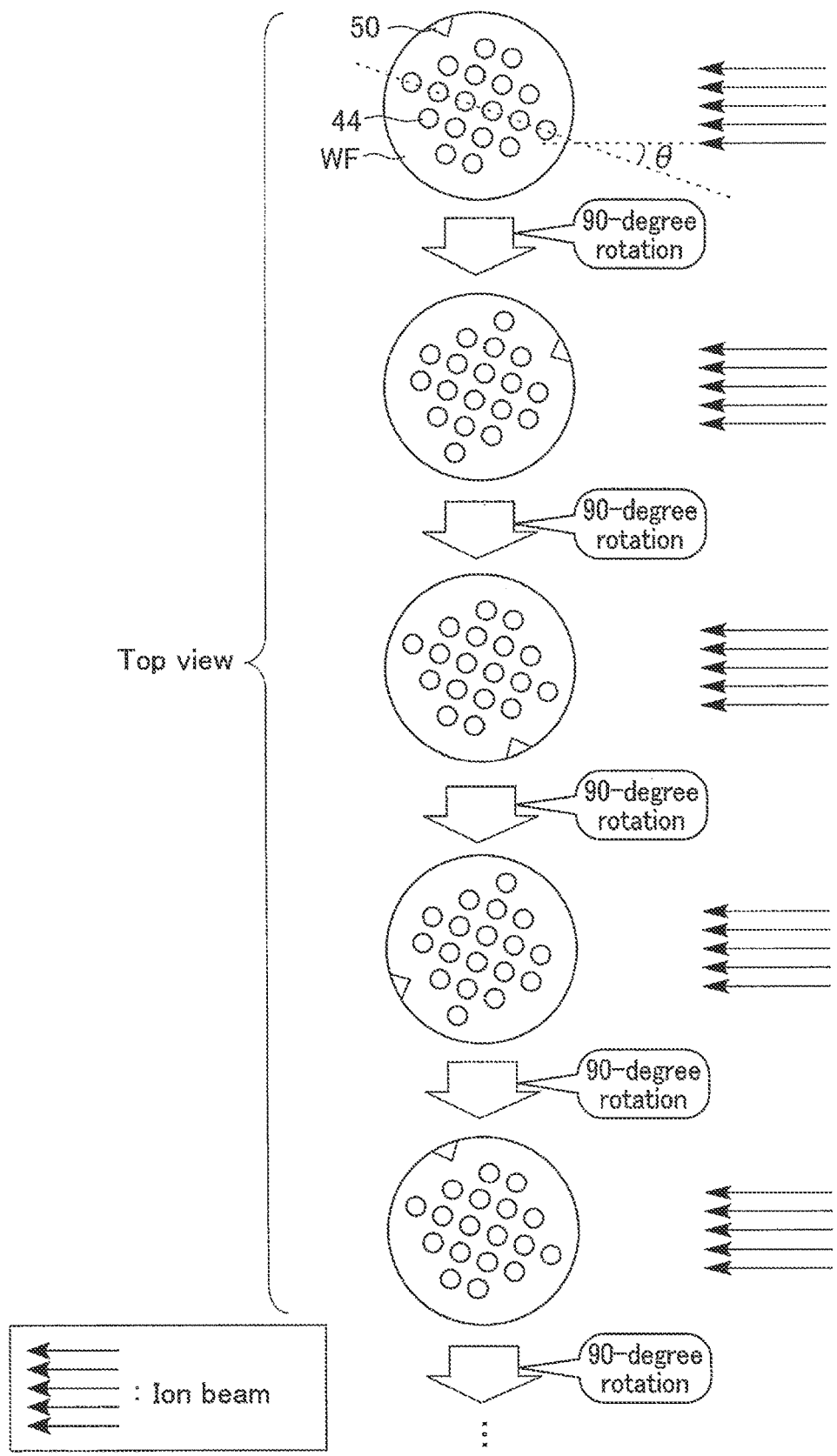
FIG. 12 is a schematic view illustrating the manufacturing method of the memory cell array in the magnetic memory device according to the embodiment.
Figure 15:
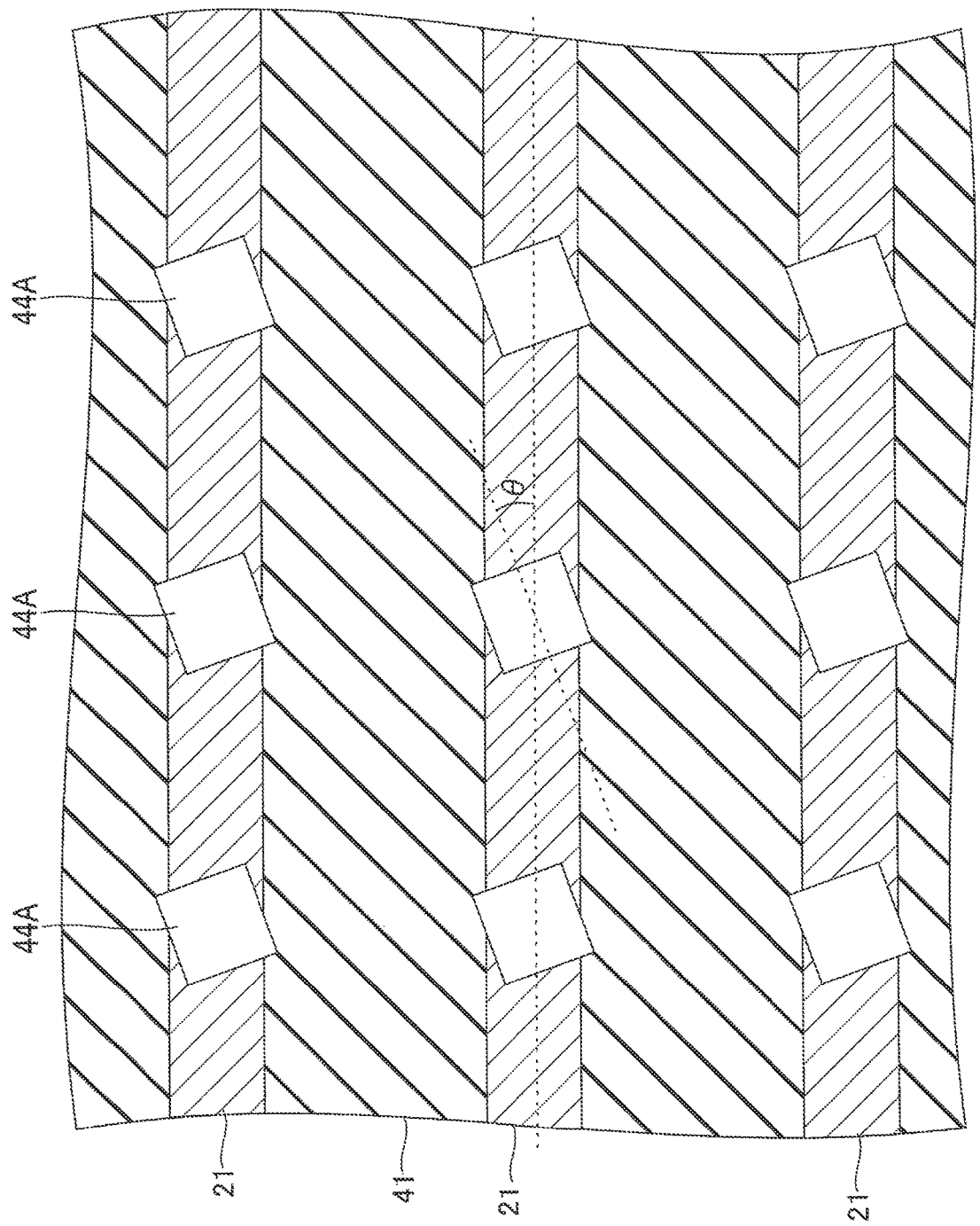
FIG. 15 is a plan view illustrating the manufacturing method of the memory cell array in the magnetic memory device according to the embodiment.

FIGS. 7, 8, 9, 11, 13, 14, 16 and 17 each are a cross-sectional view illustrating the manufacturing method of the memory cell array of the magnetic memory device according to the embodiment. Of these drawings, FIGS. 7, 9, 11, 13, 16 and 17 show cross sections corresponding to FIG. 4. FIGS. 8 and 14 show cross sections corresponding to FIG. 5, illustrating states in the same processes as in FIGS. 7 and 13, respectively. FIGS. 10 and 15 each are a plan view of the memory cell array 10 as viewed from above. FIG. 10 illustrates a state in the same process as in FIG. 9, and FIG. 15 illustrates a state in the same process as in FIGS. 13 and 14. FIGS. 11 and 12 schematically illustrate a process of forming the magnetoresistance effect element MTJ and the switching element SEL through etching using an ion beam from cross-sectional view and top view, respectively.

As shown in FIGS. 7 and 8, a plurality of conductors 21 are provided on an upper surface of a semiconductor substrate 20 serving as a wafer WF. Specifically, first, a conductor layer is provided on the upper surface of the semiconductor substrate 20, and after that, a mask in which portions other than regions corresponding to the word lines WL are open is formed by photolithography, etc. Then, by anisotropic etching using the formed mask, the conductor layer is divided into a plurality of conductors 21, and holes that reach the semiconductor substrate 20 are formed. The anisotropic etching in this process is, for example, Reactive Ion Etching (RIE). Then, insulators 41 are provided in the formed holes.

Next, as shown in FIGS. 9 and 10, a magnetoresistance effect element layer 42, a switching element layer 43, and a mask 44 are formed in this order on upper surfaces of the conductors 21 and insulators 41.

Specifically, first, the magnetoresistance effect element layer 42 is provided on the upper surfaces of the conductors 21 and insulators 41. The magnetoresistance effect element layer 42 is a layer stack in which the above-described layers included in the magnetoresistance effect element MTJ are formed as plates and stacked in the order shown in FIG. 6.

Then, the switching element layer 43 is provided on an upper surface of the magnetoresistance effect element layer 42. The switching element layer 43 is a layer stack in which at least one layer structure for functioning as a switching element SEL is formed as a plate.

Then, the mask 44 in which portions other than regions corresponding to the magnetoresistance effect elements MTJ and switching elements SEL to be formed in the magnetoresistance effect element layer 42 and switching element layer 43 are open is formed by photolithography, etc. on an upper surface of the switching element layer 43. The mask 44 contains, for example, titanium nitride (TiN), and protects portions that function as the magnetoresistance effect elements MTJ and the switching elements SEL during ion beam etching described later. For example, the mask 44 is provided as a plurality of cylindrical structures that are arranged in a matrix on the upper surface of the switching element layer 43, and each cylindrical structure protects a region corresponding to a single memory cell MC. The diameter of the cylinder is larger than the length d4 of the tunnel barrier layer TB shown in FIG. 6.

Next, as shown in FIGS. 11 and 12, the magnetoresistance effect element layer 42 and the switching element layer 43 are etched through ion beam etching. As a result, portions that are not protected by the masks 44 are removed from the magnetoresistance effect element layer 42 and switching element layer 43, and conductors 21 and insulators 41 that are located below those portions are exposed.

In the ion beam etching, the wafer WF that has been processed up to the process shown in FIG. 10 is placed on a stage (not shown) of an ion beam generator (not shown). The stage holds the wafer WF rotatably about the Z axis. The ion beam generator emits an ion beam toward the wafer WF on the stage, with a predetermined azimuth angle and a predetermined incident angle $\alpha$. The azimuth angle is defined here as an angle formed by a given axis on the surface of the wafer WF (e.g., the X axis or the Y axis) and a projection of the ion beam toward the surface of the wafer WF. In FIG. 12, a direction in which the masks 44 are aligned at the shortest distance (i.e., a direction in which each of a plurality of conductors 21 extends, or a direction in which a plurality of conductors 21 are aligned) is set as the given axis on the surface of the wafer WF. FIG. 12 illustrates a case where the azimuth angle initially set with respect to such a given axis is an angle $\theta$. The incident angle $\alpha$ is defined as an angle formed by the surface of the wafer WF and the ion beam, which is not shown in FIG. 12.

The ion beam generator emits the ion beam toward the wafer WF with the wafer WF fixed with respect to the emission direction of the ion beam, without rotating the wafer WF. Then, after a predetermined time period has elapsed, the ion beam generator stops emitting the ion beam, and rotates the wafer WF by a given angle (90 degrees) about the Z axis. With this rotation, the azimuth angle changes from $\theta$ to $\theta+90$ degrees. Then, the ion beam generator fixes the wafer WF with respect to the emission direction of the ion beam, and emits the ion beam toward the wafer WF. In this manner, the process of emitting the ion beam with the wafer WF fixed (ion beam emitting process) and the process of rotating the wafer WF with the emission of the ion beam stopped (wafer rotating process) are repeated more than once. In the example of FIG. 12, the change in the position of an alignment mark 50 on the wafer WF indicates that the azimuth angle changes by 90 degrees each time the wafer WF is rotated by 90 degrees with respect to the emission direction of the ion beam.

By the ion beam etching described above, the masks 44 and the portions that are not protected by the masks 44 (portions to be removed from the switching element layer 43 and magnetoresistance effect element layer 42) are finally etched.

It should be noted that the rotation angle of the wafer WF in one wafer rotating process is preferably set, for example, to a value obtained by dividing one rotation of the wafer WF (i.e., 360 degrees) into an integral number of equal parts. In addition, the rotation angle of the wafer WF is preferably set such that in a layout including a plurality of memory cells MC, there is no change in the selectivity of etching by ion beam (i.e., there is no change in the impact of shadowing by the masks 44) in every ion beam emitting process. For example, in a layout in which a plurality of memory cells MC are arranged at square intersections of a mesh as shown in FIG. 3, the rotation angle of the wafer WF in one wafer rotating process may be set, for example, to 90 degrees.

Through the ion beam etching described above, a plurality of layer stacks each including elements 22 and 23 are formed from the magnetoresistance effect element layer 42 and switching element layer 43.

To divide the magnetoresistance effect element layer 42 into a plurality of elements 22 in a reliable manner, the conductors 21 and the insulators 41 located below the magnetoresistance effect element layer 42 are partially etched through the above described ion beam etching. As shown in FIG. 13, while the mask 44 is etched by height L3 to be a mask 44A, the magnetoresistance effect element layer 42 and the portion 41A of the insulator 41 are etched by height L1+L2a in total. Also, as shown in FIG. 14, while the mask 44 is etched by height L3 to be the mask 44A, the magnetoresistance effect element layer 42 and the portion 41B of the insulator 41 are etched by height L1+L2b in total.

With the ion beam etching described above, the height L1+L2a can be made substantially the same as the height L1+L2b. For example, the ratio of the height L1+L2b to the height L1+L2a can be made 1.5 or less ((L1+L2b)/(L1+L2a)≤1.5), and more desirably, it can be made 1.1 or less ((L1+L2b)/(L1+L2a)≤1.1).

Further, as shown in FIG. 15, by such a discrete ion beam etching from four specific directions as described above, the mask 44A and the elements 22 and 23 located below the mask 44A have a rectangular shape as viewed from above. This rectangular shape is formed so as to have sides intersecting with both the X axis and the Y axis in accordance with the azimuth direction of the ion beam.

Figure 16:
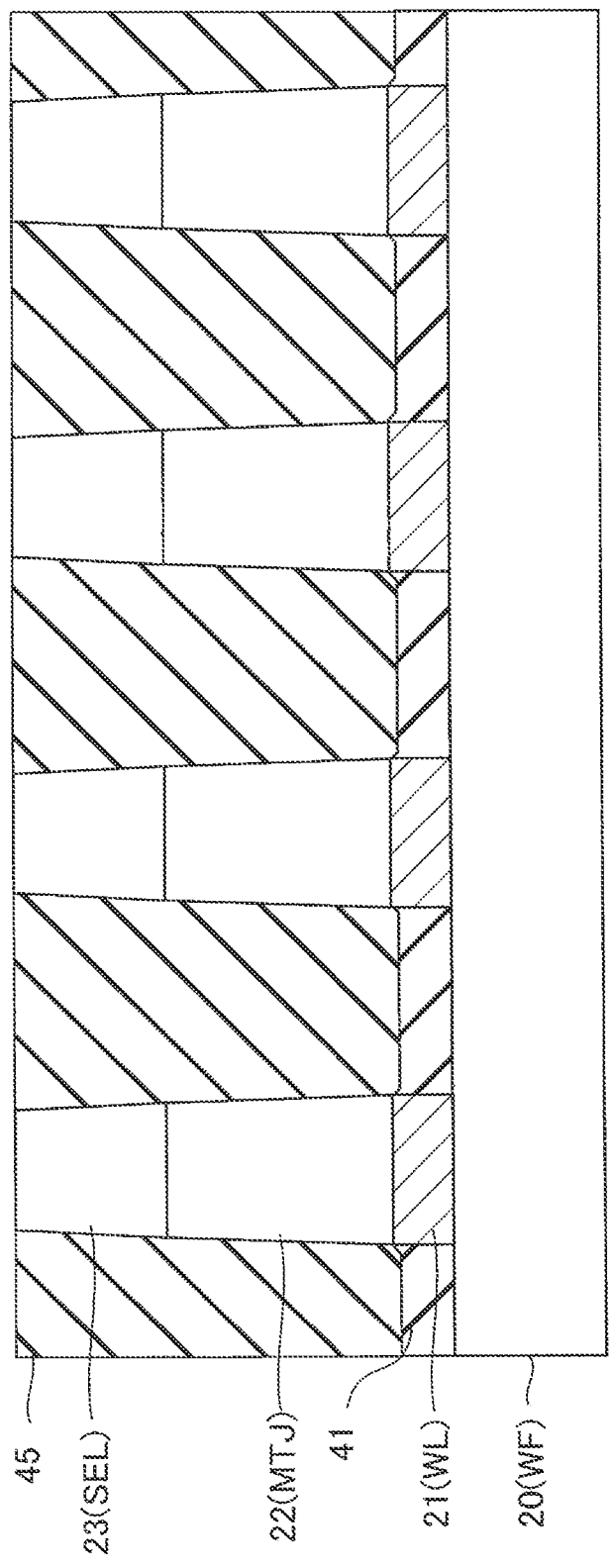
FIG. 16 is a cross-sectional view illustrating the manufacturing method of the memory cell array in the magnetic memory device according to the embodiment.

Next, as shown in FIG. 16, after the masks 44A are removed, spaces made by etching the magnetoresistance effect element layer 42 and the switching element layer 43 with the ion beam are filled with insulators 45.

Figure 17:
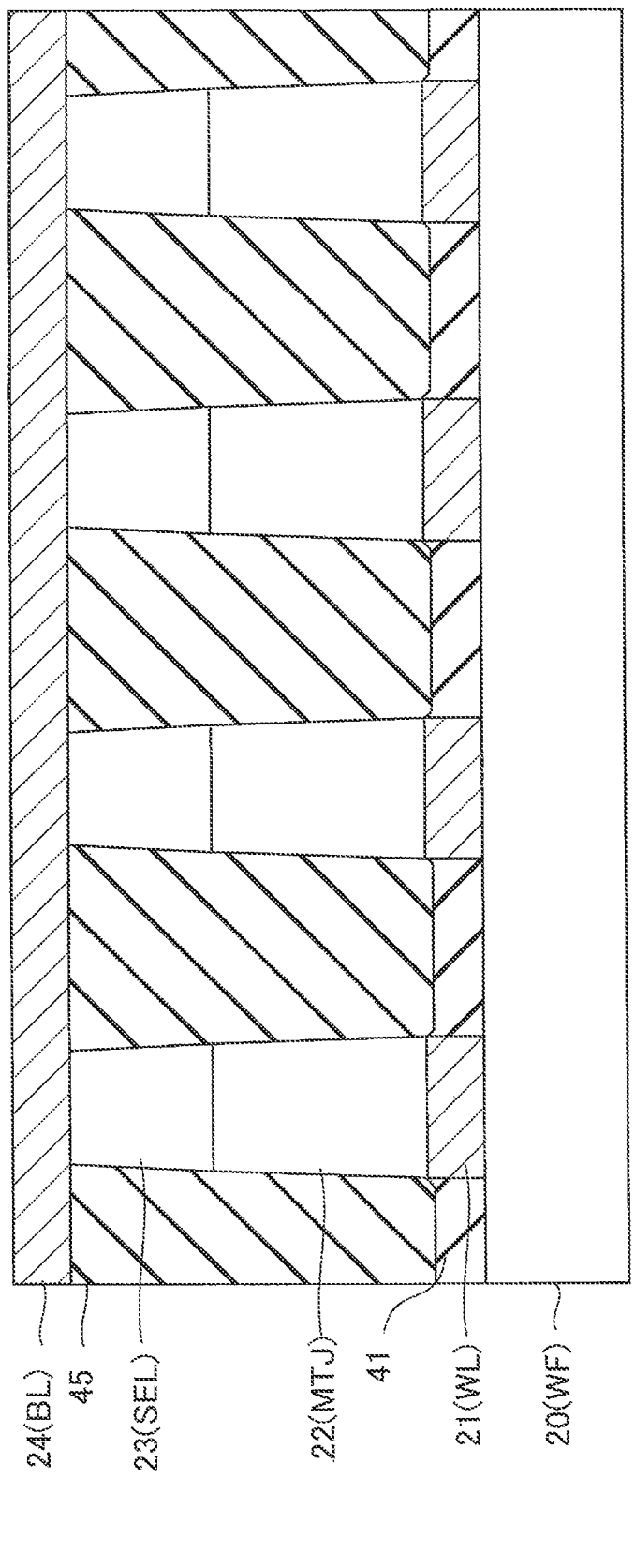
FIG. 17 is a cross-sectional view illustrating the manufacturing method of the memory cell array in the magnetic memory device according to the embodiment.

Next, as shown in FIG. 17, a plurality of conductors 24 aligned along the X axis are each provided on an upper surface of the elements 23 and insulators 45. Specifically, first, a conductor layer is provided on the upper surface of the elements 23 and insulators 45, and after that, a mask in which portions other than regions corresponding to the bit lines BL are opened is formed by photolithography, etc. Then, by anisotropic etching using the formed mask, the conductor layer is divided into a plurality of conductors 24, and holes that reach the insulators 45 are formed. The anisotropic etching in this process is, for example, RIE. Then, insulators (not shown) are provided in the formed holes.

By the method described above, a configuration corresponding to the memory cell array 10 is formed on the wafer WF. Finally, the wafer WF is diced into a plurality of chips each serving as the magnetic memory device 1.

1.3. Advantageous Effects of Present Embodiment

According to the present embodiment, in the process of ion beam etching, the ion beam generator and the stage holding the wafer WF changes the azimuth angle formed by the wafer WF and the ion beam in a discrete manner, not in a continuous manner. Specifically, the azimuth angle, which is an angle formed by the X axis and the projection of the ion beam toward the wafer WF, is changed in such a manner as to periodically repeat discrete values (such as $\theta$, $\theta+90$ degrees, $\theta+180$ degrees, $\theta+270$ degrees, $\theta$, . . . ). As a result, the magnetoresistance effect element MTJ has a rectangular cross section with two sides parallel to the X' axis and the other two sides parallel to the Y' axis. Such a magnetoresistance effect element MTJ can have a cross-sectional area larger than that of a magnetoresistance effect element MTJ having a circular cross section with a diameter equal to the length of one side of the rectangular cross section. Thus, as compared to such a magnetoresistance effect element MTJ having a circular cross section, the magnetoresistance effect element according to the embodiment can have large resistance-area product RA, magnetoresistance ratio MR, and retention characteristic A.

Furthermore, the above described azimuth angle intersects with both the X axis and the Y axis. As a result, in the ion beam etching, the impact of shadowing based on the geometric relationship between the etching target regions of the magnetoresistance effect element layer 42 and the masks 44 can be eased.

To supplement the description, the etching rate changes depending on the positional relationship between the arrangement of the masks 44 and the incident direction of the ion beam (i.e., the azimuth angle). Specifically, when the ion beam is emitted from a direction along the X axis, the etching rate is lower in a region, of the etching target regions, between two masks 44 aligned along the X axis of a plurality of masks 44 arranged in a matrix, than in a region between two diagonally aligned masks 44. Similarly, when the ion beam is emitted from a direction along the Y axis, the etching rate is lower in a region, of the etching target regions, between two masks 44 aligned along the Y axis of a plurality of masks 44 arranged in a matrix, than in a region between two diagonally aligned masks 44. On the other hand, when the projection of the ion beam toward the wafer WF intersects with both the X axis and the Y axis, the etching rate in an etching target region between two masks 44 aligned along the X axis or the Y axis is higher than the above two examples. In addition, the tapered shape of the magnetoresistance effect element MTJ is also improved such that the difference between its upper and lower surfaces becomes smaller.

According to the embodiment, the azimuth angle of the ion beam with respect to the wafer WF is set discretely using a proper angle θ (where θ is not equal to 0 degrees, 90 degrees, 180 degrees, or 270 degrees). As a result, the ion beam can be prevented from being emitted from a direction in which an impact of shadowing becomes great, and the etching can be performed selectively under the situation where the decrease in the etching rate is suppressed. Thus, as compared to a case where ion beam etching is performed in a situation where there exists an etching target region greatly impacted by shadowing, as in the above two examples, the ion beam etching in the embodiment can be performed efficiently, and inconsistency in the etching rate in the etching target regions can be improved. Accordingly, even in such a dense arrangement in which the aspect ratio AR of the magnetoresistance effect element MTJ exceeds 1 to 1.5, a memory cell array 10 that satisfies the requirements that the length d1 be 50 nm or less and the length d3 be 20 nm or less, can be manufactured.

2. Modifications, Etc

The embodiment described above can be modified in various manners.

According to the above embodiment, the magnetoresistance effect element layer 42 is formed below the switching element layer 43, but this is not restrictive. For example, the magnetoresistance effect element layer may be formed above the switching element layer. If this is the case, both the switching element layer and the magnetoresistance effect element layer may be etched through ion beam etching, or only the magnetoresistance effect element layer may be etched through ion beam etching.

Figure 18:
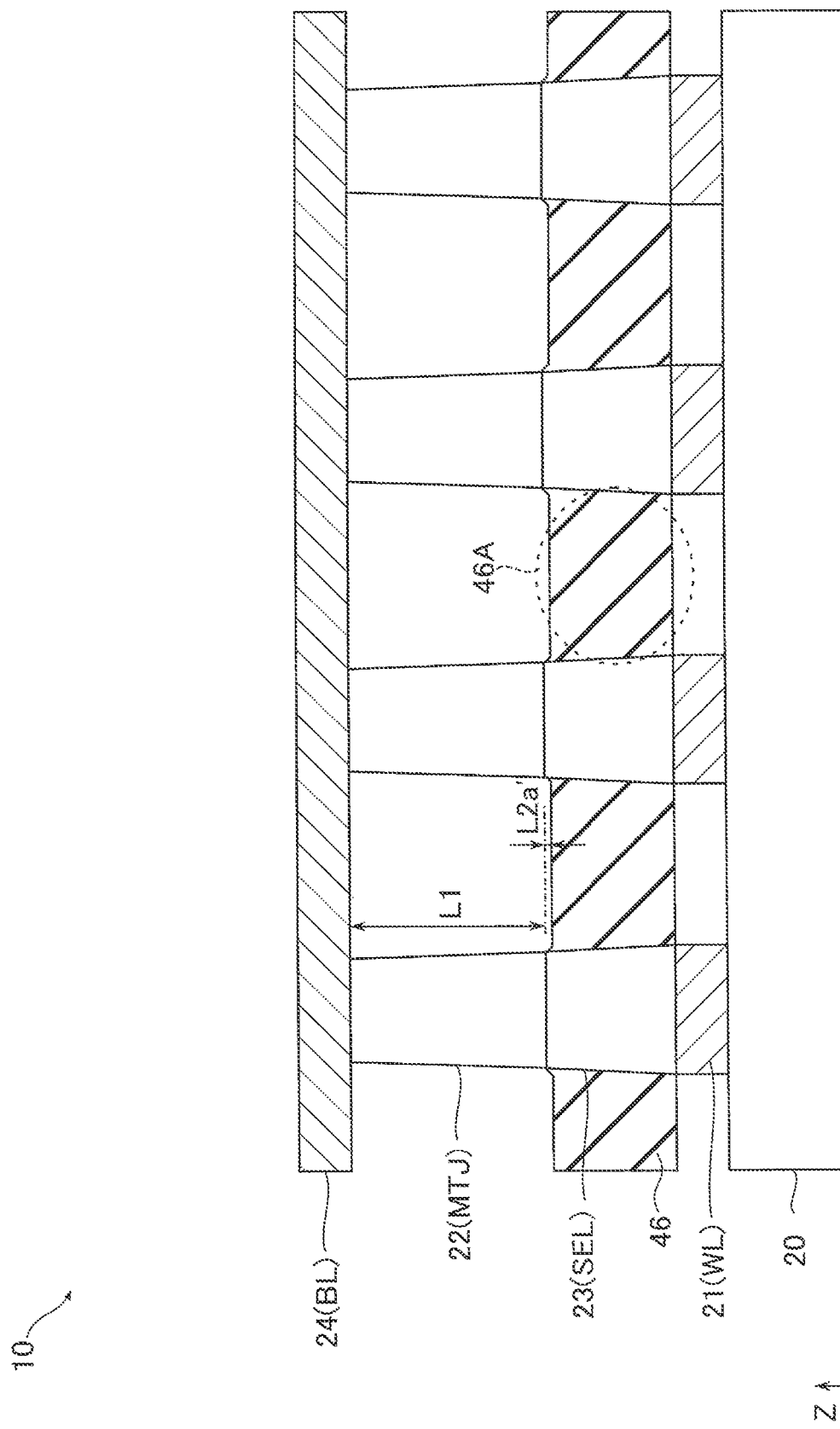
FIG. 18 is a cross-sectional view illustrating a configuration of a memory cell array of a magnetic memory device according to a modification.

FIGS. 18 and 19 each show an example of a cross-sectional view illustrating a configuration of a memory cell array of a magnetic memory device according to a modification. FIGS. 18 and 19 correspond to FIGS. 4 and 5 referred to in connection with the embodiment, and illustrate a memory cell array 10A in which the magnetoresistance effect element layer 42 is formed above the switching element layer 43.

As shown in FIGS. 18 and 19, the memory cell array 10A is provided above the semiconductor substrate 20.

For example, a plurality of conductors 21 are provided on an upper surface of the semiconductor substrate 20. Each of the conductors 21 has conductivity and functions as a word line WL.

On an upper surface of each conductor 21, a plurality of elements 23 that each function as a switching element SEL are provided. Each element 23 has a tapered shape such that its cross-sectional area along the XY plane becomes smaller in an upward direction. For example, the elements 23 provided on the upper surface of one conductor 21 are aligned along the X axis. In other words, the elements 23 aligned along the X axis are commonly coupled to the upper surface of one conductor 21. An insulator 46 is provided between two adjacent elements 23. With this configuration, the elements 23 are insulated from each other.

An upper surface of a portion 46A of the insulator 46 between two elements 23 adjacent to each other along the cross section shown in FIG. 18 is located at a level lower than that of lower surfaces of the elements 22 by height L2a'. There is almost no change in the level of the upper surface of the portion 46A irrespective of the distance from the elements 23.

An upper surface of a portion 46B of the insulator 46 between two elements 23 adjacent to each other along the cross section shown in FIG. 19 is positioned at a level lower than that of lower surfaces of the elements 22 by height L2b'. There is almost no change in the level of the upper surface of the portion 46B irrespective of the distance from the elements 23, as with the upper surface of the portion 46A.

On an upper surface of each element 23, an element 22 that functions as a magnetoresistance effect element MTJ is provided. The element 22 has a height L1 along the Z axis, and like the element 23, it has a tapered shape such that its cross-sectional area along the XY plane becomes smaller as it goes upward. An upper surface of each of a plurality of elements 22 is coupled to one of a plurality of conductors 24.

The conductors 24 have conductivity, and they function as bit lines BL. The elements 22 aligned along the Y axis are commonly coupled to one conductor 24.

In the above-described configuration of the memory cell array 10A, the height L2a' and the height L2b' can be regarded as being substantially the same. That is, the upper surface of the portion 46A and the upper surface of the portion 46B in the insulator 46 can be regarded as being positioned at the same level. Specifically, the ratio of the height (L1+L2b') to the height (L1+L2a') may be, for example, 0.9 or more and 1.5 or less (i.e., 0.9≤(L1+L2b')/(L1+L2a')≤1.5). More desirably, the ratio of the height (L1+L2b') to the height (L1+L2a') may be 0.9 or more and 1.1 or less (i.e., 0.9≤(L1+L2b)/(L1+L2a)≤1.1).

With the above configuration, the distance between the mask 44 and the elements 22 can be shortened. This allows a reduction in the impact of shadowing when the ion beam etching is performed.

Furthermore, according to the above embodiment, the magnetoresistance effect element layer 42 and the switching element layer 43 are simultaneously subjected to ion beam etching, but this is not restrictive. For example, it is possible for the switching element layer 43 to be etched first through RIE etc., and then for only the magnetoresistance effect element layer 42 to be subjected to ion beam etching.

Furthermore, according to the above embodiment, the magnetoresistance effect element MTJ has a top-free structure in which the storage layer SL is provided above the reference layer RL, but this is not restrictive. For example, the magnetoresistance effect element MTJ may have a bottom-free structure in which the storage layer SL is provided below the reference layer RL.

Furthermore, according to the above embodiment, the memory cell array 10 has a structure in which all the memory cells MC are provided in the same layer, but this is not restrictive. For example, the memory cell array 10 may have word lines WLd provided below bit lines BL and word lines WLu provided above bit lines BL, and have a plurality of memory cells MCd provided between the word lines WLd and the bit lines BL and a plurality of memory cells MCu provided between the word lines WLu and the bit lines BL. That is, the number of layers of memory cells MC, which are stacked along the Z axis, is not limited to two, and may be designed to any number of layers.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device comprising:
a first conductor extending along a first direction;
a second conductor extending along a second direction and above the first conductor; and
a first layer stack provided between the first conductor and the second conductor and including a first magnetoresistance effect element,
wherein:
the first layer stack has a rectangular shape along a stack surface of the first layer stack,
the rectangular shape of the first layer stack has first side and a second side intersecting with the first side, each of the first side and the second side intersecting with both the first direction and the second direction,
the first magnetoresistance effect element includes a first ferromagnetic layer, a second ferromagnetic layer, and a nonmagnetic layer provided between the first ferromagnetic layer and the second ferromagnetic layer, and
a magnetization direction of the first ferromagnetic layer and a magnetization direction of the second ferromagnetic layer are each perpendicular to the stack surface of the first layer stack.

2. The device of claim 1, further comprising:
a third conductor extending along the first direction and being aligned with the first conductor along the second direction; and
a second layer stack provided between the third conductor and the second conductor and including a second magnetoresistance effect element,
wherein:
the second layer stack has a rectangular shape along a stack surface of the second layer stack, and
the rectangular shape of the second layer stack has a third side and a fourth side intersecting with the third side, each of the third side and the fourth side intersecting with both the first direction and the second direction.

3. The device of claim 2, wherein the first side of the rectangular shape of the first layer stack is parallel to the third side of the rectangular shape of the second layer stack.

4. The device of claim 2, further comprising:
a fourth conductor extending along the second direction and being aligned with the second conductor along the first direction; and
a third layer stack provided between the third conductor and the fourth conductor and including a third magnetoresistance effect element,
wherein:
the third layer stack has a rectangular shape along a stack surface of the third layer stack, and
the rectangular shape of the third layer stack has a fifth side and a sixth side intersecting with the fifth side, each of the fifth side and the sixth side intersecting with both the first direction and the second direction.

5. The device of claim 4, wherein the first side of the rectangular shape of the first layer stack is parallel to the fifth side of the rectangular shape of the third layer stack.

6. The device of claim 4, further comprising:
an insulator provided between the first conductor and the third conductor below the first layer stack, the second layer stack, and the third layer stack,
wherein a first portion of the insulator between the first layer stack and the second layer stack and a second portion of the insulator between the first layer stack and the third layer stack have upper surfaces of a same level.

7. The device of claim 2, wherein a distance between the first layer stack and the second layer stack is at most 50 nm.

8. The device of claim 7, wherein the first side of the rectangular shape in the nonmagnetic layer has a length of 20 nm or less.

9. The device of claim 8, wherein the nonmagnetic layer includes an oxide of magnesium (Mg).

10. The device of claim 9, wherein the first ferromagnetic layer and the second ferromagnetic layer include at least one element selected from iron (Fe), cobalt (Co), and nickel (Ni).

11. The device of claim 10, wherein:
the first ferromagnetic layer takes a first resistance value in accordance with a first current that flows from the first ferromagnetic layer to the second ferromagnetic layer, and
the first ferromagnetic layer takes a second resistance value in accordance with a second current flowing from the second ferromagnetic layer to the first ferromagnetic layer.

12. The device of claim 11, wherein the first resistance value is lower than the second resistance value.

13. The device of claim 1, wherein the first layer stack further includes a switching element coupled in series to the first magnetoresistance effect element.

* * * * *